(12) United States Patent
Karasawa et al.

(10) Patent No.: US 7,164,228 B2
(45) Date of Patent: Jan. 16, 2007

(54) DISPLAY PANEL AND ELECTRONIC APPARATUS WITH THE SAME

(75) Inventors: Yasushi Karasawa, Shiojiri (JP); Shigeo Nojima, Suwa (JP); Ryoichi Nozawa, Tatsuno-machi (JP)

(73) Assignee: Seiko Epson Corporation, Tokyo (JP)

(*) Notice: Subject to any disclaimer, the term of this patent is extended or adjusted under 35 U.S.C. 154(b) by 159 days.

(21) Appl. No.: 10/737,857

(22) Filed: Dec. 18, 2003

(65) Prior Publication Data
US 2004/0178724 A1 Sep. 16, 2004

(30) Foreign Application Priority Data

| Dec. 27, 2002 | (JP) | ............................. | 2002-378850 |
| Dec. 27, 2002 | (JP) | ............................. | 2002-378851 |
| Jan. 20, 2003 | (JP) | ............................. | 2003-010732 |
| Jul. 14, 2003 | (JP) | ............................. | 2003-196237 |

(51) Int. Cl.
*H05B 33/24* (2006.01)
*H05B 33/22* (2006.01)
*H05B 33/00* (2006.01)

(52) U.S. Cl. ..................... 313/498; 313/506; 313/501

(58) Field of Classification Search ................ 313/506, 313/498
See application file for complete search history.

(56) References Cited

U.S. PATENT DOCUMENTS

| 5,691,044 A * | 11/1997 | Oyama et al. ............... 428/216 |
| 5,986,401 A | 11/1999 | Thompson et al. |
| 6,084,349 A * | 7/2000 | Ueoka et al. ............... 313/587 |
| 6,091,195 A * | 7/2000 | Forrest et al. ............... 313/504 |
| 6,188,176 B1 * | 2/2001 | Nakaya et al. ............... 313/504 |
| 6,252,246 B1 * | 6/2001 | Arai et al. ..................... 257/40 |
| 6,259,200 B1 * | 7/2001 | Morita et al. ............... 313/498 |
| 6,285,123 B1 * | 9/2001 | Yamada et al. ............... 313/495 |
| 6,414,439 B1 * | 7/2002 | Tuenge et al. ............ 315/169.1 |
| 2001/0011868 A1 * | 8/2001 | Fukunaga et al. .......... 313/506 |
| 2002/0011783 A1 * | 1/2002 | Hosokawa ................... 313/504 |
| 2002/0038998 A1 * | 4/2002 | Fujita et al. ................. 313/495 |
| 2002/0167262 A1 * | 11/2002 | Porter et al. ................. 313/483 |
| 2003/0117071 A1 * | 6/2003 | Lee et al. .................... 313/512 |

FOREIGN PATENT DOCUMENTS

| JP | A-8-321381 | 12/1996 |
| JP | A-4-312791 | 3/1999 |
| JP | A-8-222374 | 5/1999 |
| JP | A-11-273870 | 10/1999 |
| JP | A-2001-230072 | 8/2001 |
| JP | A-2003-17274 | 1/2003 |

* cited by examiner

*Primary Examiner*—Mariceli Santiago
*Assistant Examiner*—Elizabeth Rielley
(74) *Attorney, Agent, or Firm*—Oliff & Berridge, PLC

(57) ABSTRACT

There is provided a display panel capable of reducing the reflection of light, which is incident from the exterior, from a display, to enhance visibility out of doors. The display panel, which includes on a substrate a plurality of light-emitting layers, which form pixels, is characterized in that the display panel includes low-reflection layers formed between the substrate and the light-emitting layer and between the light-emitting layers, the low-reflection layer includes a first low-reflection layer made of titanium and a second low-reflection layer made of an indium tin oxide. In addition, the low-reflection layer may be provided to a sealant in a region between the light-emitting layers.

23 Claims, 14 Drawing Sheets

1: SUBSTRATE
2: ELECTRODE CONTACT
3: FIRST LOW-REFLECTION LAYER
4: SECOND LOW-REFLECTION LAYER
5A: HOLE INJECTING/CARRYING LAYER
5B: LIGHT-EMITTING LAYER
6: CONDUCTIVE FILM
7: BANK
8: SEALING FILM
31: GATE ELECTRODE
37: GATE INSULATING FILM
51: INTERLAYER INSULATING FILM
52: FLATTENED INSULATING FILM
61: INSULATING PASSIVATION FILM

1: SUBSTRATE
2: ELECTRODE CONTACT
3: FIRST LOW-REFLECTION LAYER
4: SECOND LOW-REFLECTION LAYER
5A: HOLE INJECTING/CARRYING LAYER
5B: LIGHT-EMITTING LAYER
6: CONDUCTIVE FILM
7: BANK
8: SEALING FILM
31: GATE ELECTRODE
37: GATE INSULATING FILM
51: INTERLAYER INSULATING FILM
52: FLATTENED INSULATING FILM
61: INSULATING PASSIVATION FILM

2: ELECTRODE CONTACT
3: FIRST LOW-REFLECTION LAYER
20: FIRST TFT
21: GATE ELECTRODE
22: DRAIN ELECTRODE
30: SECOND TFT
31: GATE ELECTRODE
36: EXTENDED PORTION OF GATE ELECTRODE 31
39: EXTENDED PORTION OF COMMON ELECTRODE com 1: SUBSTRATE
2: ELECTRODE CONTACT
3: FIRST LOW-REFLECTION LAYER
4: SECOND LOW-REFLECTION LAYER
5A: HOLE INJECTING/CARRYING LAYER
5B: LIGHT-EMITTING LAYER
6: CONDUCTIVE FILM
7: BANK
8A: SEALING PLATE
9: BLACK RESIST
15: SPACE
31: GATE ELECTRODE
37: GATE INSULATING FILM
51: INTERLAYER INSULATING FILM
52: FLATTENED INSULATING FILM
61: INSULATING PASSIVATION FILM

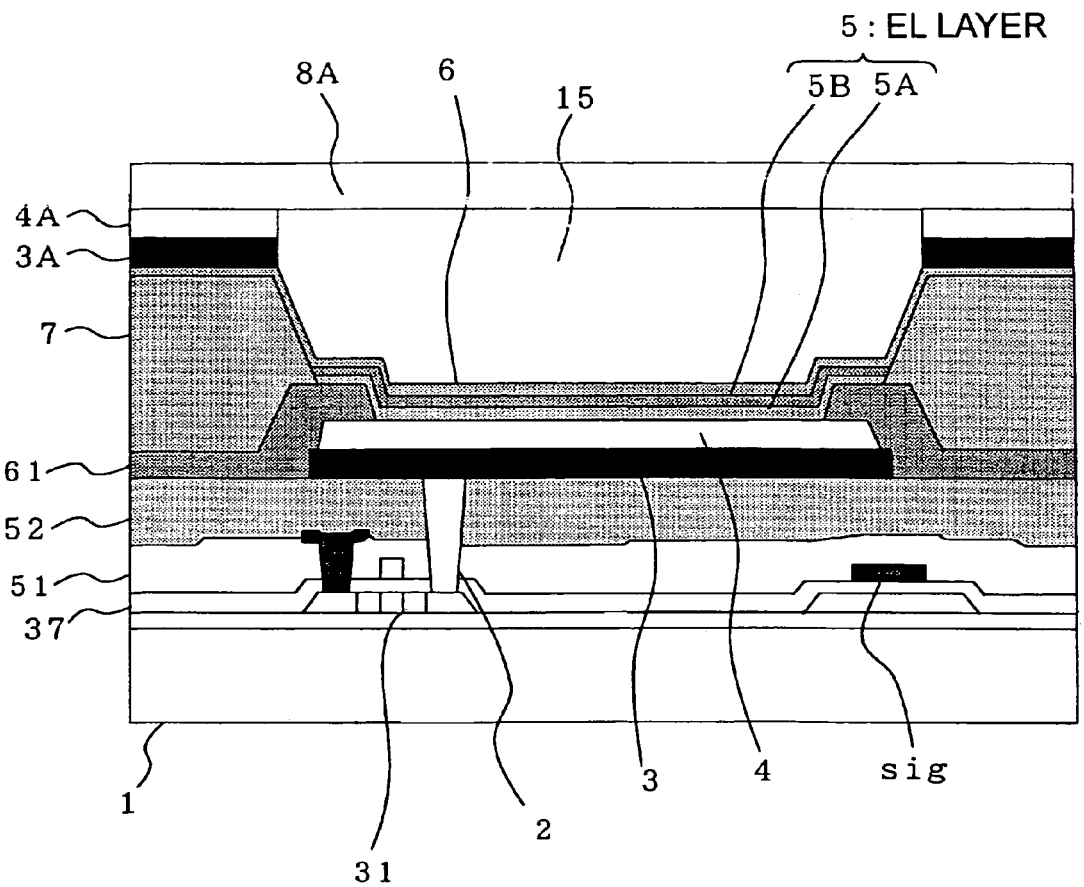

- 1: SUBSTRATE
- 2: ELECTRODE CONTACT
- 3: FIRST LOW-REFLECTION LAYER
- 4: SECOND LOW-REFLECTION LAYER
- 3A: THIRD LOW-REFLECTION LAYER
- 4A: FOURTH LOW-REFLECTION LAYER
- 5A: HOLE INJECTING/CARRYING LAYER
- 5B: LIGHT-EMITTING LAYER
- 6: CONDUCTIVE FILM
- 7: BANK
- 8A: SEALING PLATE
- 15: SPACE
- 31: GATE ELECTRODE
- 37: GATE INSULATING FILM
- 51: INTERLAYER INSULATING FILM
- 52: FLATTENED INSULATING FILM
- 61: INSULATING PASSIVATION FILM

FIG. 9

- 1: SUBSTRATE
- 2: ELECTRODE CONTACT
- 3: FIRST LOW-REFLECTION LAYER
- 4: SECOND LOW-REFLECTION LAYER
- 5A: HOLE INJECTING/CARRYING LAYER
- 5B: LIGHT-EMITTING LAYER
- 6: CONDUCTIVE FILM
- 7: BANK
- 8: SEALING FILM
- 10: BLACK RESIST
- 31: GATE ELECTRODE
- 37: GATE INSULATING FILM
- 51: INTERLAYER INSULATING FILM
- 52: FLATTENED INSULATING FILM
- 61: INSULATING PASSIVATION FILM

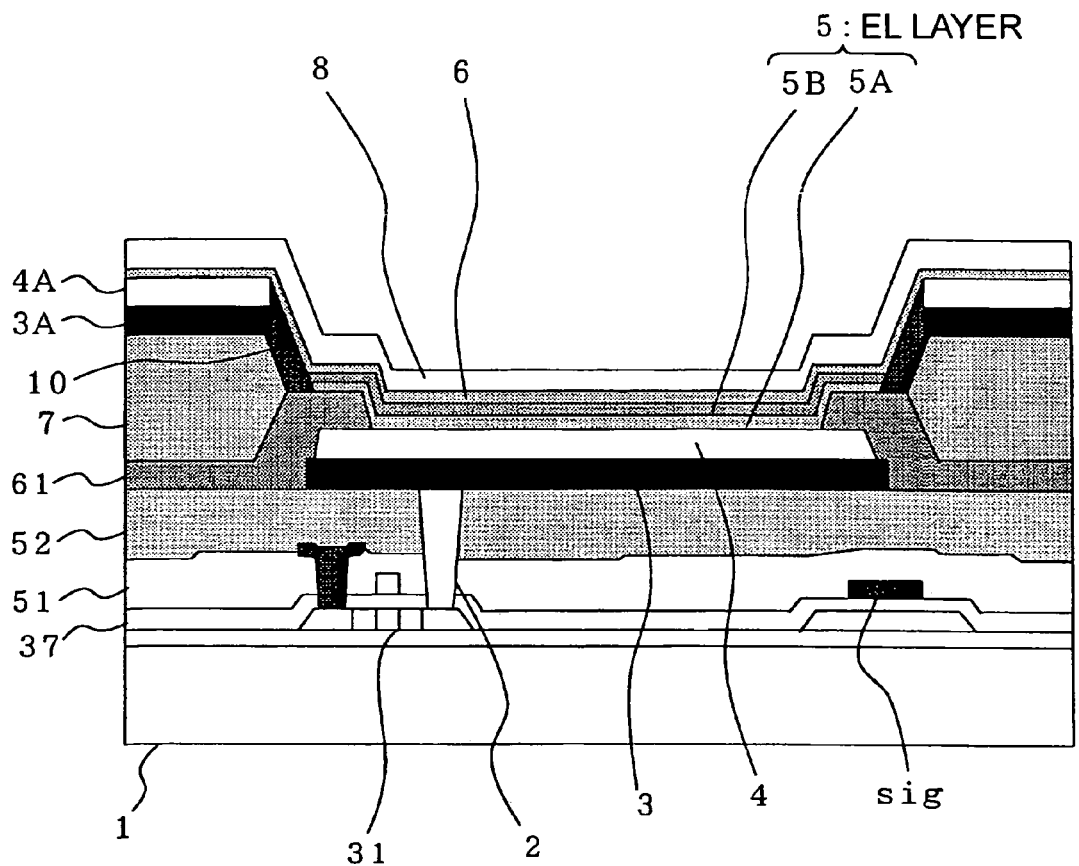

1: SUBSTRATE
2: ELECTRODE CONTACT
3: FIRST LOW-REFLECTION LAYER
4: SECOND LOW-REFLECTION LAYER
3A: THIRD LOW-REFLECTION LAYER
4A: FOURTH LOW-REFLECTION LAYER
5A: HOLE INJECTING/CARRYING LAYER
5B: LIGHT-EMITTING LAYER
6: CONDUCTIVE FILM
7: BANK
8: SEALING FILM
10: BLACK RESIST
31: GATE ELECTRODE
37: GATE INSULATING FILM
51: INTERLAYER INSULATING FILM
52: FLATTENED INSULATING FILM
61: INSULATING PASSIVATION FILM

FIG.11

1: SUBSTRATE
2: ELECTRODE CONTACT
3A: THIRD LOW-REFLECTION LAYER
4A: FOURTH LOW-REFLECTION LAYER
5A: HOLE INJECTING/CARRYING LAYER
5B: LIGHT-EMITTING LAYER
6: CONDUCTIVE FILM
7: BANK
8: SEALING FILM
11: BLACK RESIST
12: ELECTRODE (ITO)
31: GATE ELECTRODE
37: GATE INSULATING FILM
51: INTERLAYER INSULATING FILM
52: FLATTENED INSULATING FILM
61: INSULATING PASSIVATION FILM

- 1: SUBSTRATE
- 2: ELECTRODE CONTACT
- 5A: HOLE INJECTING/CARRYING LAYER
- 5B: LIGHT-EMITTING LAYER
- 6: CONDUCTIVE FILM
- 7: BANK
- 8: SEALING FILM
- 10: BLACK RESIST
- 11: BLACK RESIST
- 12: ELECTRODE (ITO)
- 31: GATE ELECTRODE
- 37: GATE INSULATING FILM
- 51: INTERLAYER INSULATING FILM
- 52: FLATTENED INSULATING FILM
- 61: INSULATING PASSIVATION FILM

DISPLAY PANEL AND ELECTRONIC APPARATUS WITH THE SAME

BACKGROUND OF THE INVENTION

1. Field of Invention

The present invention relates to a display panel and the like, and more particularly, to the enhancement of visibility that is reduced due to the reflection of light incident from the exterior.

2. Description of Related Art

In the related art, display devices using a liquid crystal display (LCD) device or an organic electroluminescent element (hereinafter, referred to as an organic EL element) are employed in various electronic apparatus, such as a cellular phone, a personal computer, an electronic organizer, a portable electronic game console, and the like. As a result, users have many opportunities to look at a display screen for the electronic apparatus outdoors as well as indoors.

In this case, the light incident on the display screen from the exterior causes a problem. The incident light is reflected by the screen and viewed by viewers. Usually, more intense light is incident on the display screen outdoors than indoors and is reflected by the display screen to the viewers. As a result, the contrast of the display device is reduced, thereby making it difficult to see the display screen.

Herein, a related case where an organic EL element is employed will now be considered. Since the organic EL element is self-luminescent, it has a high visibility. Further, since its responsive speed is quick, the display device employing the element is a promising device to display a moving picture. However, with current organic EL elements, it is difficult to provide high luminance, while securing a long lifespan. Therefore, it is impossible to avoid a reduction in visibility outdoors due to the effect of light incident from the exterior.

Therefore, in order to enhance the contrast, a display device has been proposed in which anti-reflection films, including layered films of $TiO_2$ and $SiO_2$, are formed on the inner and outer surfaces of a cover to seal the display device (for example, see Japanese Unexamined Patent Application Publication No. 2001-230072). Further, another display device has been proposed in which a circular polarizer is mounted on a surface of the cover to suppress the reflection of the light incident from the exterior (for example, see Japanese Unexamined Patent Application Publication No. 8-321381). In addition, there is a case of achieving a high contrast by absorbing light using TaOx (tantalum oxide), which is deposited under a reactive atmosphere or by CVD, as an absorption layer (for example, see Japanese Patent No. 2901370). In addition, there has been proposed an organic EL element with an electric charge injecting layer having a light absorption diffusion property (for example, see Japanese Patent No. 2931229), a display panel with a black absorbent formed at a bottom side thereof (for example, see U.S. Pat. No. 5,986,401), or an organic EL element utilizing a black multi-layered film as the electrode (for example, see Japanese Unexamined Patent Application Publication No. 2003-17274).

However, in such related art display devices, since expensive equipment, such as a circular polarizer, must be attached to the display device, more expense and effort are required, thereby increasing its cost. In addition, there is a display device capable of suppressing reflectance by using a multi-layered film including three or more layers. But the structure and manufacturing method become complicated due to the plurality of films to be deposited.

SUMMARY OF THE INVENTION

Accordingly, in order to address the aforementioned problems, the present invention provides a display panel and an apparatus using the display panel by using an enhanced low-reflection structure in the display panel and enhancing a related art low-reflectance structure, thereby enhancing outdoor visibility as well.

According to one aspect of the present invention, there is provided a display panel, which includes on a substrate a plurality of light-emitting layers, which form pixels, including: low-reflection layers formed between the substrate and the light-emitting layers and between the light-emitting layers, each of the low-reflection layers being formed by laminating a first low-reflection layer made of titanium and a second low-reflection layer made of an indium alloy or gallium zinc oxide. As such, the reflection of light incident on the display panel from the exterior is reduced by the interaction of each of the first and second low-reflection layers and their interfaces. Further, since a basic structure includes two layers and the second low-reflection layer also serves as a hole injecting layer, the structure and the manufacture of the display panel are simplified.

In addition, the low-reflection layers deposited between the light-emitting layers are formed on the bottom portion of partition walls to separate the respective light-emitting layers. As a result, the low-reflection layer can be integrally formed between the substrate and the light-emitting layer and between the light-emitting layers.

According to another aspect of the present invention, there is provided a display panel, which includes on a substrate a plurality of light-emitting layers, which form pixels, and a sealant disposed on a display side of the light-emitting layers to seal the light-emitting layers, including: low-reflection layers formed between the substrate and the light-emitting layers, each of the low-reflection layers being formed by laminating a first low-reflection layer made of titanium and a second low-reflection layer made of an indium alloy or gallium alloy; and black layers formed on a portion of the sealant opposite to partition walls between the light-emitting layers. In this case, the reflection of the light incident on the display panel from the exterior is reduced by the first and second low-reflection layers in the light-emitting layer portion and is also reduced by the black layer in the partition wall of the light-emitting layer.

According to another aspect of the present invention, there is provided a display panel, which includes on a substrate a plurality of light-emitting layers, which form pixels, and a sealant disposed on a display side of the light-emitting layers to seal the light-emitting layers, including: low-reflection layers formed between the substrate and the light-emitting layers, each of the low-reflection layers being formed by laminating a first low-reflection layer made of titanium and a second low-reflection layer made of an indium alloy or gallium alloy; and low-reflection layers formed on a portion of the sealant opposite to partition walls between the light-emitting layers, each of the low-reflection layers being formed by laminating a third low-reflection layer made of titanium and a fourth low-reflection layer made of an indium alloy or gallium alloy. In this case, the reflection of the light incident on the display panel from the exterior is reduced by the first and second low-reflection layers in the light-emitting layer portion and is also reduced by the third and fourth low-reflection layers in the partition wall of the light-emitting layer.

According to another aspect of the present invention, there is provided a display panel, which includes on a substrate a plurality of light-emitting layers, which form pixels, and partition walls provided between the light-emitting layers, including: low-reflection layers formed between the substrate and the light-emitting layers, each of the low-reflection layers being formed by laminating a first low-reflection layer made of titanium and a second low-reflection layer made of an indium alloy or gallium alloy; and low-reflection layers formed on the top surfaces of the partition walls, each of the low-reflection layers being formed by laminating a third low-reflection layer made of titanium and a fourth low-reflection layer made of an indium alloy or gallium alloy.

As such, the reflection of the light incident on the display panel from the exterior is reduced by the first and second low-reflection layers in the light-emitting layer portion and is also reduced by the third and fourth low-reflection layers in the partition wall.

According to another aspect of the present invention, there is provided a display panel, which includes on a substrate a plurality of light-emitting layers, which form pixels, and partition walls provided between the light-emitting layers, including: low-reflection layers formed between the substrate and the light-emitting layers, each of the low-reflection layers being formed by laminating a first low-reflection layer made of titanium and a second low-reflection layer made of an indium alloy or gallium alloy; and black layers formed on the top surfaces of the partition walls. As such, the reflection of the light incident on the display panel from the exterior is reduced by the first and second low-reflection layers in the light-emitting layer portion and is also reduced by light absorption of the black layer in the partition wall.

According to another aspect of the present invention, there is provided a display panel, which includes, on a substrate, a plurality of light-emitting layers, which form pixels, and partition walls provided between the light-emitting layers, including: black layers formed between the substrate and the light-emitting layers; and low-reflection layers formed on the top surfaces of the partition walls, each of the low-reflection layers being formed by laminating a third low-reflection layer made of titanium and a fourth low-reflection layer made of an indium alloy or gallium alloy. As such, the reflection of the light incident on the display panel from the exterior is reduced by the light absorption of the black layer in the light-emitting layer portion and is also reduced by the third and fourth low-reflection layers in the partition wall.

According to another aspect of the present invention, there is provided a display panel, which includes on a substrate a plurality of light-emitting layers, which form pixels, and partition walls provided between the light-emitting layers, including: black layers formed between the substrate and the light-emitting layers and on the top surfaces of the partition walls. As a result, the reflection of the light incident on the display panel from the exterior is reduced by the light absorption of the black layer in the light-emitting layer portion and between the light-emitting layers.

According to another aspect of the present invention, there is provided a display panel, which includes on a substrate a plurality of light-emitting layers, which form pixels, partition walls provided between the light-emitting layers, and a sealant disposed on a display side of the respective light-emitting layers to seal the light-emitting layers, including: black layers formed between the substrate and the light-emitting layers; and black layers formed on the sealant at the portion opposite to the partition walls. In this case, the reflection of the light incident on the display panel from the exterior is reduced by the light absorption of the black layer corresponding to the light-emitting layer in the light-emitting layer portion, and is reduced by the light absorption of the black layer formed in the sealant in the partition wall.

According to another aspect of the present invention, there is provided a display panel, which includes, on a substrate, a plurality of light-emitting layers, which form pixels, partition walls provided between the light-emitting layers, and a sealant disposed on a display side of the light-emitting layers to seal the light-emitting layers, including: black layers formed between the substrate and the light-emitting layers; and low-reflection layers formed on the sealant at the portion opposite to the partition walls, each of the low-reflection layers being formed by laminating a third low-reflection layer made of titanium and a fourth low-reflection layer made of an indium alloy or gallium alloy. In this case, the reflection of the light incident on the display panel from the exterior is reduced by the light absorption of the black layer in the light-emitting layer portion and is also reduced by the low-reflection layer formed in the sealant in the partition wall.

In the above aspects, a black layer is formed on the sides of the partition wall. As a result, since light incident on the sides of the partition wall is absorbed by the black layer, the reflection of the light by the display panel is further reduced.

In addition, in the aspects, the first and third low-reflection layers, made of titanium, are layers made of any one of titanium oxide, titanium nitride, and an alloy of titanium and tungsten. Titanium oxide, titanium nitride, and an alloy of titanium and tungsten have a light absorption property of a visible ray, which is equal to or more than that of titanium, thereby reducing the light reflection of the display panel similar to using titanium.

In addition, in the aspects, the second and fourth low-reflection layers made of an indium alloy are layers made of any one of indium tin oxide, indium cerium oxide, and indium zinc oxide. By laminating the second or fourth low-reflection layer with a layer made of titanium, a practical low reflection structure can be achieved. Further, even when indium cerium oxide or indium zinc oxide is deposited in an atmosphere containing no oxygen, it can provide high conductivity. As a result, non-uniformity of properties depending upon the oxygen concentration in the deposition is small, and high reproducibility can be obtained in its manufacture. In addition, since the materials have high stability, deterioration with the passage of time is small. Since a work function of indium cerium oxide is suitable to supply the electric charge to the luminescent material, high efficiency of electric charge injection can be obtained. Furthermore, since a work function of indium zinc oxide is suitable to supply the electric charge to the luminescent material, high efficiency of electric charge injection can be obtained, and since internal stress of the film is low, adherence among the substrate, the light-emitting layer, the electric charge injecting layer, and the electric charge carrying layer is high, and the lifespan of the light emitting element can be prolonged.

In addition, in the above aspects, titanium is formed as the first and third low-reflection layers having a thickness of 30 to 400 nm, and indium tin oxide is formed as the second and fourth low-reflection layers having a thickness of 60 to 100 nm. When these layers are deposited with the above thickness, the reflection of the visible ray can be particularly reduced.

Further, in the above aspects, the low-reflection layer including the first low-reflection layer and the second low-reflection layer is an electrode to supply an electric charge to the light-emitting layer. As a result, the structure of the display panel is simplified. Further, the second low-reflection layer serves as a hole injecting layer, thereby simplifying the structure of the display panel.

In addition, in the above aspects, the surface of the second low-reflection layer is polished. By polishing the surface, unevenness formed on the surface of the low-reflection layer due to the crystallization of the indium alloy or the like which form the second low-reflection layer can be reduced, and interface between the electrode to supply the electric charge to the light-emitting layer and the light-emitting layer, the electric charge injecting layer or the electric charge carrying layer is planarized. As a result, since the local concentration of electric field is avoided in the light-emitting layer, the uniformity of luminescence of the light-emitting layer can be enhanced and the lifespan of the luminescence can be prolonged.

In addition, in the above aspects, the surface of the second low-reflection layer is further formed with a chromium film. As a result, the low-reflection layer serves as the hole injecting layer, thereby enhancing the injection efficiency of the hole.

According to another aspect of the present invention, there is provided an electronic apparatus that includes a display panel, as described in the above aspects, which performs a display function. As a result, the visibility of the electronic apparatus can be enhanced, thereby obtaining the electronic apparatus capable of easily being used out of doors.

Accordingly, it can be more easily seen out of doors.

BRIEF DESCRIPTION OF THE DRAWINGS

FIG. 9 is a partial cross-sectional view of a display panel according to a second example of the second exemplary embodiment of the present invention;

FIG. 11 is a partial cross-sectional view of a display panel according to a second example of a third exemplary embodiment of the present invention;

DETAILED DESCRIPTION OF EXEMPLARY EMBODIMENTS

First Exemplary Embodiment

Figure 1:
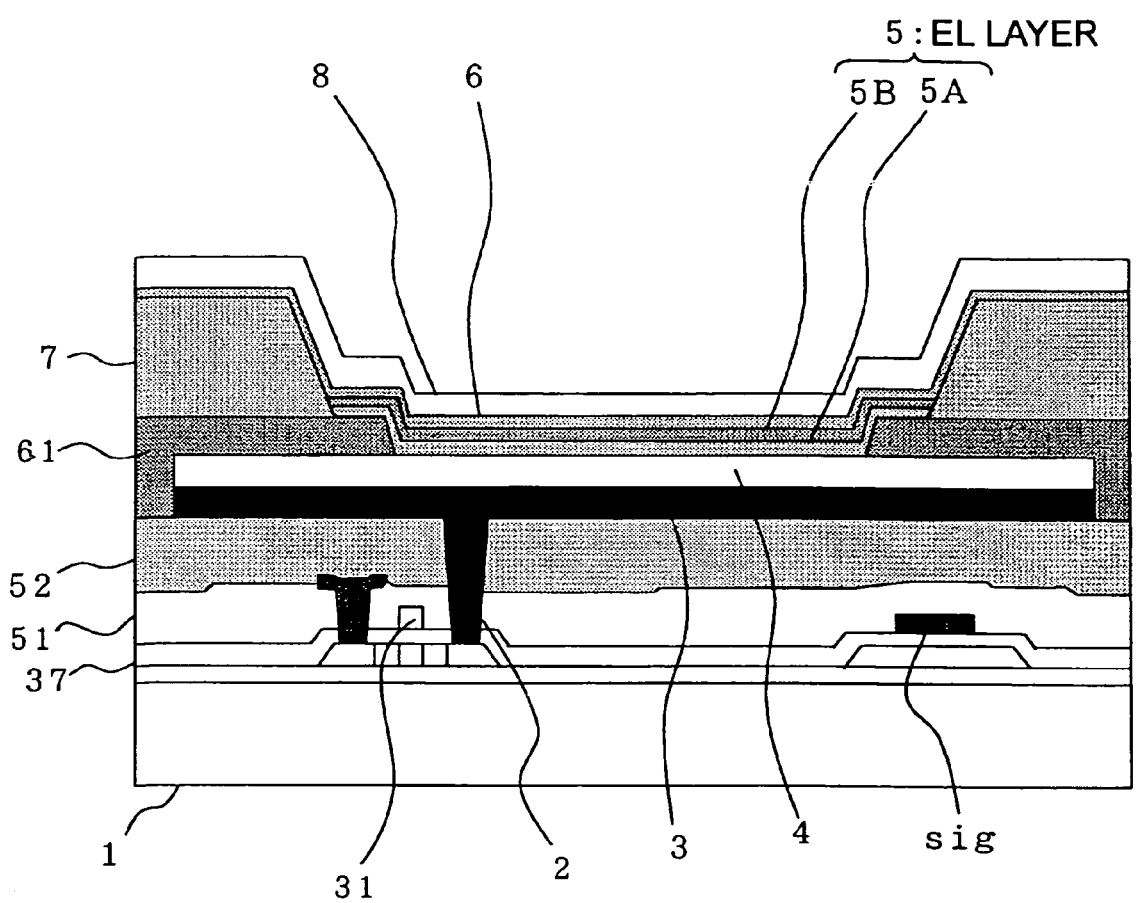
FIG. 1 is a partial cross-sectional view of a display panel according to a first exemplary embodiment.

FIG. 1 is a partial cross-sectional view showing a structure of a display panel according to a first exemplary embodiment of the present invention. In FIG. 1, reference numeral 1 indicates a substrate. In this exemplary embodiment, the substrate 1 is provided with a semiconductor film having a thin film transistor (hereinafter, referred to as TFT) serving as a control element (driving element).

Figure 2:
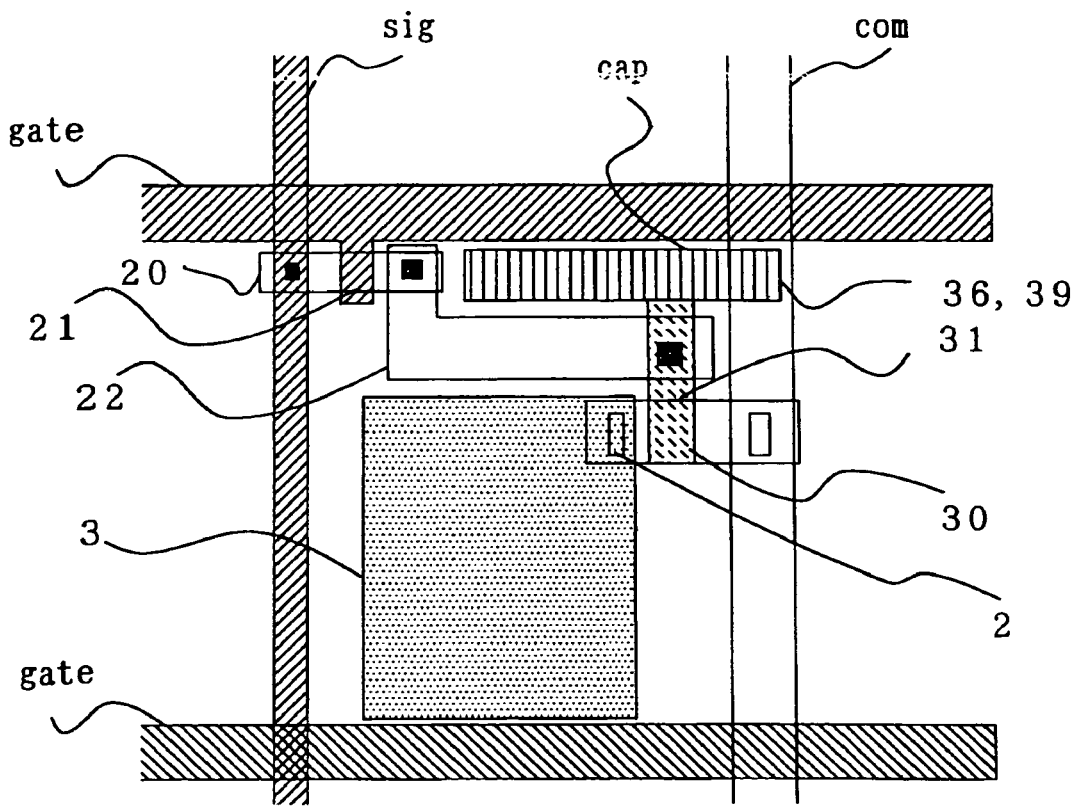
FIG. 2 is a plan view showing one pixel constituting the display panel.

FIG. 2 is a plan view showing one pixel that constitutes the display panel. FIG. 2 shows elements formed on the substrate and positioned below a second low-reflection layer 4 shown in FIG. 1. A gate electrode 21 of a first TFT 20 is supplied with a scan signal via a scanning line "gate". A holding capacitor "cap" is adapted to hold an image signal supplied from a data line "sig" via the first TFT 20. A gate electrode 31 of a second TFT 30 is supplied with the image signal held by the holding capacitor "cap".

The first TFT 20 and the second TFT 30 are formed on an island-shaped semiconductor film. The gate electrode 21 of the first TFT 20 is constructed as a part of the scanning line "gate" and is supplied with the scan signal. One side of a source/drain region of the first TFT 20 is electrically connected to the data line "sig" via a through-hole of an interlayer insulating film 51, and the other side of the source/drain region is electrically connected to a drain electrode 22. The drain electrode 22 is electrically connected to the gate electrode 31 of the second TFT 30 via the through-hole of the interlayer insulating film 51. The second TFT 30 is electrically connected to an electrode contact 2 concurrently formed with the data line "sig" via the through-hole of the interlayer insulating film 51 at one side of the source/drain region. The electrode contact 2 is electrically connected to a first low-reflection layer 3, a second low-reflection layer 4, and an EL layer 5 (hole injecting/carrying layer 5A and light-emitting layer 5B) via a through-hole of a flattened insulating film 52.

The second TFT 30 is electrically connected to common feeding lines "com" via the through-hole of the interlayer insulating film 51 at the other side of the source/drain region. An extended portion 39 of the common feeding lines "com" is opposite to an extended portion 36 of the gate electrode 31 of the second TFT 30 to form the holding capacitor "cap", with the interlayer insulating film 51, as a dielectric film, being interposed between them. Further, instead of the above structure where the holding capacitor "cap" is formed between the common feeding lines "com", the holding capacitor may be formed between the capacitor lines connected in parallel to the scanning line "gate". In addition, the holding capacitor "cap" may be formed by using the drain region of the first TFT 20 and the gate electrode 31 of the second TFT 30. Herein, although the TFT is used as an element to control the luminescence of the respective pixels, the present invention is not limited thereto. For example, other control elements, such as a TFD (thin film diode), an amorphous silicon thin film transistor, or the like, may be utilized. In addition, in this exemplary embodiment, silicon or glass may be used as the substrate 1. Herein, glass is used as the substrate.

Further, the electrode may be made of Al or the like, but the first low-reflection layer 3, described hereinafter, may be provided with a function of the electrode.

Next, a low-reflectance structure of the display panel will be described. The low-reflection layers including the first low-reflection layer 3 and the second low-reflection layer 4 are employed as the low-reflection structure in this exemplary embodiment. Titanium (pure titanium, Ti) is used as the material of the first low-reflection layer 3. Further, titanium nitride (TiN), an alloy of titanium/tungsten (TiW) may be used. Furthermore, the titanium may be a titanium oxide (comprised of TiOx, $Ti_2O_3$, and $Ti_2O_5$), having a surface which is oxidized. This is because reflection of light within a range of a specific wavelength can be reduced by an inherent color of TiOx. However, for the second low-reflection layer 4, ITO (indium tin oxide), IZO (indium zinc oxide), GZO (gallium zinc oxide), ICO (InCeO, indium cerium oxide) or the like may be utilized. In this exemplary embodiment, ITO may be utilized as the second low-reflection layer 4. In addition, the low-reflection layer including the first low-reflection layer 3 and the second low-reflection layer 4 serves as one electrode to supply electric charge to the EL layer 5. In addition, in this exemplary embodiment, the low-reflection layers 3 and 4 are an anode and a conductive film 6, described hereinafter, is a cathode.

Reference numeral 5 indicates the EL layer that forms the pixel, and it may include the hole injecting (carrying) layer 5A including, for example, thiophene-based conductive polymer (PEDOT), and the light-emitting layer 5B including a light emitting polymer (LEP). Alternatively, the structure of the EL layer 5 may employ a structure of separating the hole (electron) injecting layer from the hole carrying layer, a three layered structure including an electron injecting layer, a hole injecting layer and a light-emitting layer as the EL layer 5, or a structure with the EL layer 5 layered in other architectures. In addition, the second low-reflection layer 4 of ITO or the like may also serve as the hole injecting layer, while the thiophene-based conductive polymer may function as the hole carrying layer. Reference numeral 6 indicates a conductive film which forms any one electrode of a pair of electrodes to inject (supply) the holes or electrons to the EL layer 5. In this exemplary embodiment, ITO (or IZO, GZO and ICO), which is transparent in a range of a visible ray, may be utilized as the conductive film 6, as in the second low-reflection layer 4. In addition, in this case, since the ITO has a relatively high value for a work function, an interface layer of the electron injecting layer of the EL layer 5 is treated by adding, for example, cesium (Cs) to BCP (biphasic calcium phosphate) or vacuum-depositing magnesium (Mg) and silver (Ag) in order to facilitate the injection of electrons. Further, the luminescent control (control of the electric charge supply) of the EL layer 5 of the respective pixels of the display panel is achieved by the TFT that is provided in the respective pixels via the electrode (first low-reflection layer 3 or the second low-reflection layer 4) corresponding to the EL layer 5 of the respective pixels, so that it is not necessary to separately install the conductive film 6 in the EL layer 5 of the respective pixels. In addition, since ICO easily injects electrons at the work function and has a low sheet resistance compared to ITO, it is suitable to perform the electric charge supply of the entire display panel at a low voltage.

Reference numeral 7 indicates a partition wall (bank) to reduce or prevent the scattering of liquid containing discharged organic compound, in the case of forming the EL layer 5 of the polymer organic compound using a droplet ejection method employed in, for example, an inkjet printer, and to form the EL layer 5 with a uniform thickness. The partition wall 7 includes a photosensitive organic material, for example, polyimide, acryl or the like, capable of forming a pattern using a photolithography method. Reference numeral 8 indicates a sealing film, which forms a sealing member. The sealing film 8 is made of, for example, silicon nitride (SiN), ITO and the like. If the EL layer 5 is exposed to moisture, oxygen or the like, the luminescent lifespan is shortened. As a result, the sealing film 8 is disposed to reduce or prevent moisture, oxygen and so forth from permeating to the EL layer 5.

The display panel of the first exemplary embodiment forms dual low-reflection layers including the first low-reflection layer 3 and the second low-reflection layer 4, between the EL layer 5 and the substrate 1 and on the bottom portion of the partition wall 7, thereby reducing the reflection by the interaction of the respective layers and their interfaces. As a result, a display panel can be obtained that is capable of suppressing the reflection of the light incident from the exterior and enhancing visibility out of doors, without excessively complicating the structure of the display panel.

Next, an exemplary method of manufacturing the display panel according to this exemplary embodiment will now be described. First, TFT, which forms the control device, is manufactured on a glass substrate 1. For example, a method of manufacturing the TFT is as followings. First, it forms a semiconductor film of amorphous silicon having a thickness of about 30 to 70 nm by using the plasma CVD method. Then, the semiconductor film formed of the amorphous silicon film is changed into a polycrystal silicon film by performing a crystallizing process, such as a solid phase crystal growth method, a laser annealing or the like. Next, the semiconductor film is patterned to form an island-shaped film, and a gate insulating film 37 of the silicon oxide film or silicon nitride film having a thickness of about 60 to 150 nm is formed on a surface of the semiconductor film.

Next, the conductive film including a metallic film, such as titanium (Ti), tungsten (W) or the like, is formed by the sputtering method and then is patterned to form gate electrodes 21 and 31 and the extended portion 36 of the gate electrode 31. Further, a scanning line "gate" also is formed. In this state, phosphorus ions of high concentration are doped, and the source/drain region is formed to the gate electrode in a self-aligned manner.

Next, after the interlayer insulating film 51 is formed, the respective through-hole is formed, and then, the data line "sig", the drain electrode 22, the common feeding line "com", the extended portion 39 of the common feeding line "com", and the electrode contact 2 are formed. As a result, the first TFT 20, the second TFT 30, and the holding capacitor "cap" are formed. Thus, the control device is formed on the substrate 1. Although it is not shown herein, other circuit, such as a driving circuit or the like, is concurrently formed on a portion other than the display portion.

Next, in order to reduce the effect due to the level difference caused by the formation of the control element, a flattened insulating film 52 is formed. Herein, the flattened insulating film 52 is formed to have a film thickness of 2 to 3 μm by, for example, dropping photosensitive acryl resin of 15 cP ($1.5\times10^{-2}$ Pa·s) and 40 cc (40 ml), being applied on the film while spinning it at 1000 rpm of revolution during 6 seconds, and performing prebake on a hot plate. In addition, the through-hole is formed by performing a patterning in a given shape (shape corresponding to the through-hole) using the photolithography method. Thereafter, it is heat treated to settle the photosensitive acryl resin constituting the flattened insulating film 52. By repeating the above process at two times or more, the flatness of a surface of the flattened insulating film 52 (the maximum height difference between the convex portion and the concave portion) was about 0.1 μm (measured by a stylus type surface roughness gauge). In addition, the through-hole formed in the flattened insulating film 52 is formed with the electrode contact 2 to electrically connect the first low-reflection layer 3, which is to be deposited later, and the source/drain regions of the second TFT 30. In addition, the flattened insulating film 52 is formed by the spin coating method therein. Alternatively, after the silicon oxide film, the silicon nitride film or the like is formed by the CVD method, acryl, resist or the like is deposited by the spin coating method, and an etchback is performed to planarize the surface.

Figure 3:
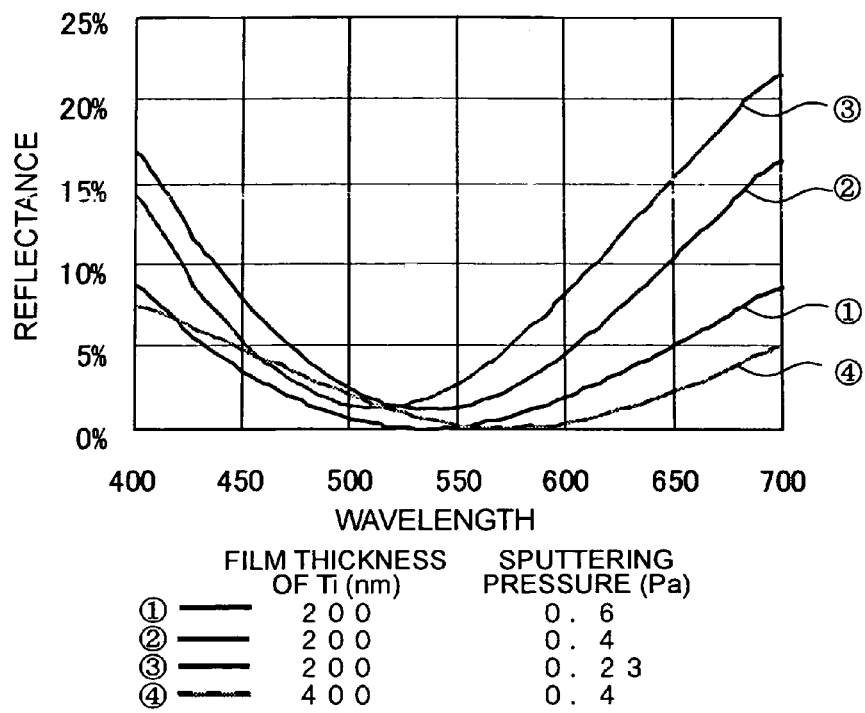
FIG. 3 is a graph depicting a relationship among a film thickness of Ti, pressure at the deposition of sputtering, and a reflectance.
Figure 4:
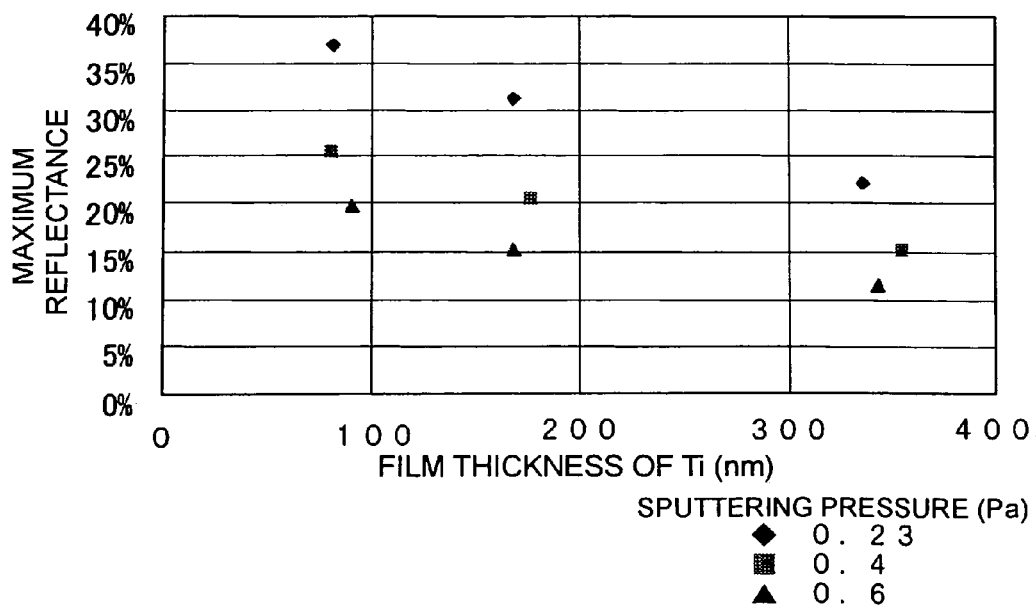
FIG. 4 is a graph depicting a relationship among a film thickness of Ti, pressure at the deposition of sputtering, and a maximum reflectance.

FIG. 3 is a graph depicting a relationship among a film thickness of Ti, which is the first low-reflection layer 3, pressure at the time of sputtering, and a reflectance. FIG. 3 depicts a reflectance in the case that an incident/emitting angle is 20°. In addition, FIG. 4 is a graph depicting a relationship among a film thickness of Ti, which is the first low-reflection layer 3, pressure at the time of sputtering, and a maximum reflectance. A term "maximum reflectance" refers to a maximum value of the reflectance in a visible ray region (400 to 700 nm) herein. In general, it may be considered that if the maximum reflectance is low, the reflection is low in the whole of the visible ray region. As can be seen in FIGS. 3 and 4, the reflectance depends upon the thickness of Ti and the pressure at the time of sputtering.

If the control device and the electrode contact 2 are formed on the substrate 1, a thin Ti layer, which forms the first low-reflection layer 3, is deposited at a position corresponding to the respective pixels by a sputtering method using a DC magnetron. In this exemplary embodiment, for example, the deposition is performed in an argon atmosphere under the conditions where the pressure is 0.3 Pa and electric power is 500 W. Although the sputtering method using the DC magnetron is utilized in this exemplary embodiment, the deposition method is not limited to the sputtering method, and an ion beam deposition method may be utilized. Herein, the first low-reflection layer 3 is deposited to have a thickness in a range of 30 to 400 nm, and preferably 100 to 400 nm. If the film thickness is below 40 nm, the reflectance is high. If it is too thick, the internal stress is easily produced, and there are possibilities that the substrate is bent, the film is peeled off or the device is broken. Further, it is difficult to process the substrate.

Figure 5:
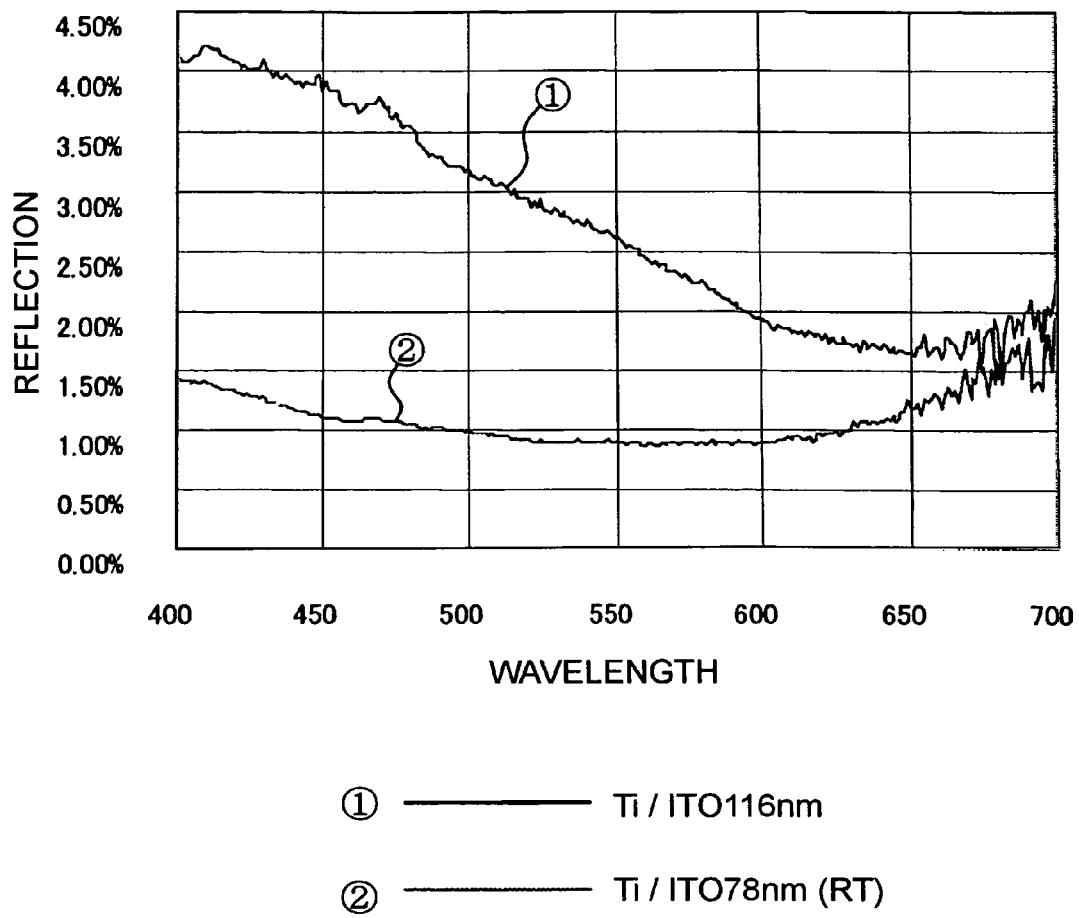
FIG. 5 is a graph depicting a relationship between a layer thickness and reflectance of Ti/ITO.
Figure 6A:
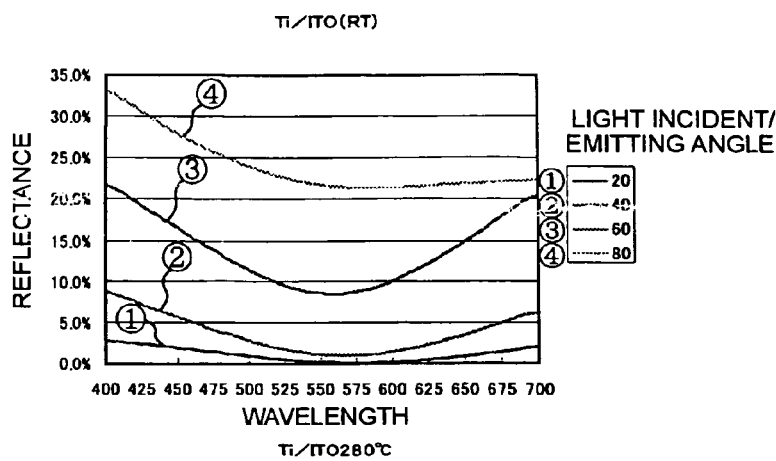
FIGS. 6A–6D are graphs depicting a relationship between a reflectance and a light incident/emitting angle according to various kinds of layers.
Figure 6B:
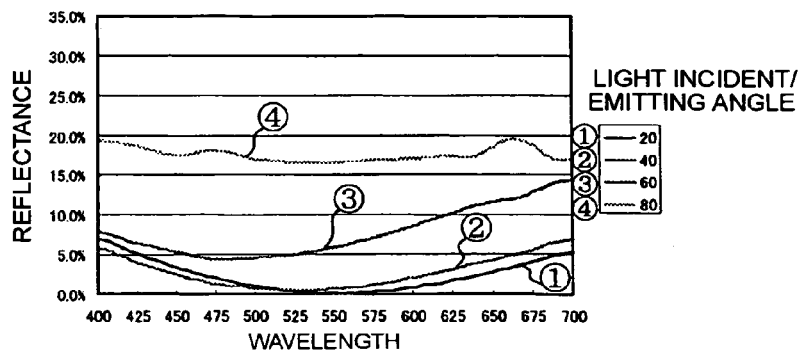
Figure 6C:
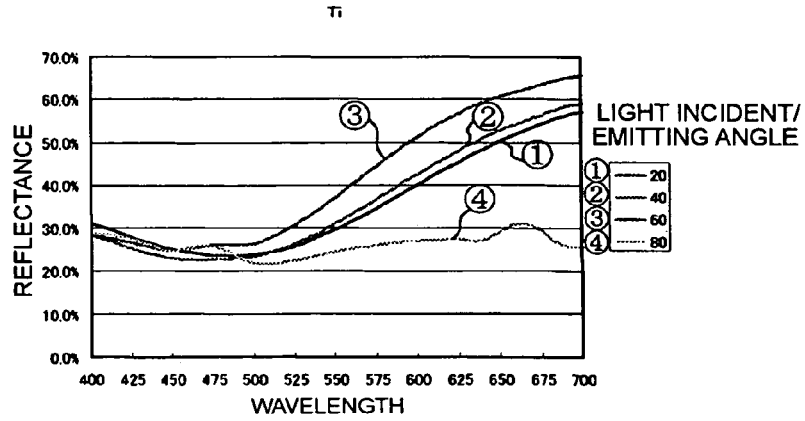
Figure 6D:
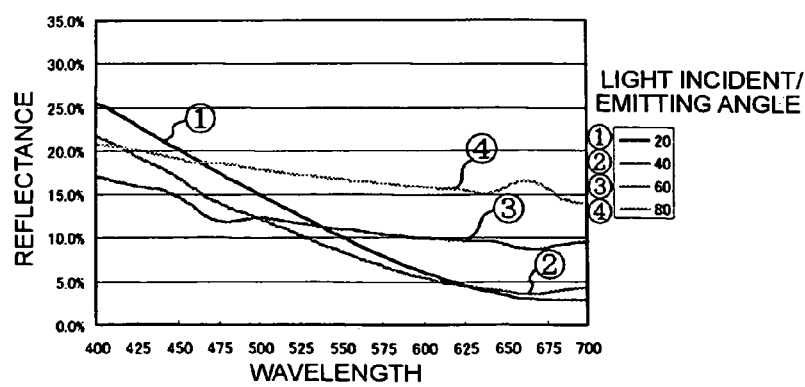

FIG. 5 is a graph depicting a relationship between a layer thickness and reflectance of the second low-reflection layer 4. ITO to form the second low-reflection layer 4 is deposited as the first low-reflection layer 3 by the sputtering method using the DC magnetron. In this exemplary embodiment, the deposition is performed by using a target of 4 inches under the conditions where the pressure is 0.3 Pa, electric power is 100 W, and the flow rate of argon gas to oxygen gas is 100:1.

Herein, a wavelength dependency of the reflectance is varied due to the variation of the film thickness, as shown in FIG. 5. If the layer thickness of the second low-reflection layer 4 is 60 to 100 nm, a low reflectance at all wavelength ranges can be obtained. In particular, if the thickness is below 80 nm, the reflectance of light is reduced to 450 to 500 nm by the light incident from the exterior.

In addition, there is fine unevenness on the surface of the second low-reflection layer 4 formed under the above conditions due to the crystallization of ITO. As a result, in the case electric charge is injected into the light-emitting layer, with the second low-reflection layer 4 being the electrode, an electric field is locally concentrated by the unevenness so that a large electric charge is locally injected into the light-emitting layer. Thus, the luminescent is not uniform or a lifespan of the luminescent is shortened. Therefore, the surface of the second low-reflection layer 4 is mechanically polished by cerium oxide or alumina. In this case, preferably, the surface of the second low-reflection layer 4 is polished so that an arithmetic mean roughness Ra measured by a stylus type surface roughness gauge is 0.1 to 1.0 nm. In order to obtain Ra of 0.1 nm or less, the polishing is very difficult, and it is required for the process of high precision during a long time. On the other hand, the effect of reducing the local concentration of the electric field in most of light-emitting layer at Ra of 1.0 or more cannot be obtained.

After the second low-reflection layer 4 is deposited by the above process, since the first low-reflection layer 3 and the second low-reflection layer 4 remain at desired portions, a desired pattern is formed with the photosensitive resin by the photolithography method. In addition, the second low-reflection layer 4 (ITO) is etched by aqua regia using the photosensitive resin as a mask. In addition, the first low-reflection layer 3 (Ti) is etched by a buffer hydrofluoric acid (BHF) solution of which the ratio of hydrofluoric acid to ammonium is 1:6. Herein, the low-reflection layer including the first low-reflection layer 3 and the second low-reflection layer 4 is selected so that it remains at a region wider than a region in which the light-emitting layer 5B is deposited. That is, the low-reflection layer is extended to a predetermined region in which the partition wall 7 is formed, and preferably, a space between the low-reflection layer and an adjacent low-reflection layer is selected to be as narrow as possible, due to an insulatable range between the light-emitting layers. The reason is because it can suppress the reduction of the visibility resulting from the reflectance from the layers of the substrate other than the first low-reflection layer, and a rear side of the substrate.

When the patterning is performed by the photolithography method, the minimum value of the spacing is substantially identical to the thickness of the layer to be processed. For example, if a thickness sum of the first low-reflection layer 3 and the second low-reflection layer 4 is 0.1 μm, the minimum value of the spacing is almost 0.1 μm. Herein, the first low-reflection layer 3 and the second low-reflection layer 4 may be formed in a desired portion only by, for example, a mask deposition method. It is a method of forming the pattern by performing the vacuum deposition, in state that a mask made of, for example, stainless steel having a thickness of 40 to 100 μm and with an opening formed at a desired portion is in close contact with the substrate. Alternatively, chromium (Cr; 4.5 eV of work function) may be deposited on the second low-reflection layer 4.

Next, an insulating passivation film 61 is formed on a predetermined region, in which the partition wall is formed, by the CVD method or the like. The insulating passivation film 61 is formed to have a thickness of 0.2 to 1.0 μm, for example, if the light-emitting layer 5B is formed to have a thickness of 0.05 to 0.2 μm.

layer 5B (LEP) and the conductive film 6 (ITO) are deposited by combining the thickness of the respective layers, as shown in Table 1, in order to reduce the reflectance.

TABLE 1

|     | CONDUCTIVE FILM 6 (ITO) | LIGHT-EMITTING LAYER 5B (LEP) | HOLE EJECTING/CARRYING LAYER 5A (PEDOT) | SECOND REFLECTION LAYER 4 (ITO) |
|-----|---|---|---|---|
| (1) | 145 ± 10 | 80 ± 10  | 90 ± 10  | 72 ± 10 |
| (2) | 145 ± 10 | 160 ± 10 | 90 ± 10  | 72 ± 10 |
| (3) | 145 ± 10 | 80 ± 10  | 180 ± 10 | 72 ± 10 |
| (4) | 145 ± 10 | 160 ± 10 | 180 ± 10 | 72 ± 10 |

UNIT: nm

Further, the partition wall 7, made of an organic material, is formed along the scanning line "gate" and the data line "sig". In the case of the deposition using the droplet ejection method, the partition wall 7 is a portion that is a bank which reduces or prevents the liquid containing the organic compound to be material from overflowing around the partition wall. Accordingly, if the light-emitting layer 5B is formed in a thickness of 0.05 to 0.2 μm, for example, the partition wall is formed at a height of 1 to 2 μm. The formation of the partition wall may be performed by, for example, a photolithography method, a printing method, or other methods.

In addition, a solution containing the polymer organic compound is discharged on the region defined by the partition wall 7 by the droplet ejection (inkjet) method to form the EL layer 5 (the hole injecting/carrying layer 5A and the light-emitting layer 5B). The EL layer 5 is formed by repeating the charging and drying of the liquid containing a desired organic compound in a red pixel layer, a green pixel layer and a blue pixel layer, respectively. As a concrete example of the light-emitting layer 5B, material of the red light-emitting layer includes an inky PPV precursor (MHE-PPV), and an inky PPV precursor doped with a pigment, such as rhodamine, perylene or the like. As the material of the green light-emitting layer, the inky PPV precursor solution diluted with a solution mixed with DMF, glycerin and diethylene glycol is used. As a material of the blue light-emitting layer, an inky polyfluorene derivative dissolved by an aromatic solvent, such as xylene or the like, is used. Next, in the case of the PPV precursor solution (PPV precursor solution is diluted by DMF and the result is used as ink), the solvent is eliminated from the PPV precursor under decompression, and the solution is conjugated and settled by a heat process at 150° C.

Alternatively, in the case of the material commonly usable for the respective pixels, each layer of the EL layer 5 may be deposited by using the spin coating method, the dipping method or the like. In addition, in the case the organic EL element of the EL layer 5 is made of a lower molecule organic compound, the region, on which the EL layer 5 is deposited, remains. After other regions are masked, the region may be deposited with the organic compound of the respective layers. Alternatively, in order to enhance the efficiency of electron injection from the conductive film 6, an electron injecting layer including, for example, magnesium/silver (Mg/Ag) may be deposited by the vacuum deposition method. If the EL layer 5 is formed, the conductive film 6 of ITO is deposited on the entire surface of at least the display portion by using the vacuum deposition method.

Herein, in the case the first low-reflection layer 3 is made of titanium (including titanium oxide), preferably, the hole injecting/carrying layer 5A (PEDOT), the light-emitting Furthermore, on the conductive film 6, the sealing film 8 is formed on the entire display panel by using a transparent resin or thin layer. Thereby, the EL layer 5 can be protected if it comes into contact with moisture or air, its properties are varied and its lifespan is shortened. As the sealing film 8, after, for example, SiON (silicon oxynitride) or MgO (magnesium oxide) is deposited in a film thickness, through which a visible ray can permeate, by the vacuum deposition method, it is adhered to a polymer film, such as polyvinyl fluoride, etc., by adhesive or is fused by heat. In addition, the display portion may be covered by a transparent resin or glass described hereinafter.

FIG. 6 is a graph depicting a relationship between a wavelength of the reflectance and a light incident/emitting angle, in which the first low-reflection layer 3 and the second low-reflection layer 4 are deposited. In FIG. 6(a), titanium of forming the first low-reflection layer 3 is deposited by the sputtering method and ITO of forming the second low-reflection layer 4 is deposited by the sputtering method at room temperature (RT) so that the layers have a thickness of 78 nm. In FIG. 6(b), after the sputtering method is performed under the same conditions as above, the layers are treated in an atmosphere at a temperature of 280° C. during one hour. In FIG. 6(c), only titanium of the first low-reflection layer 3 is deposited by the sputtering method. Further, in FIG. 6(d), a three-layered structure including Al, ITO, and Al is provided. In FIG. 6(d), the conditions, such as layer thickness of ITO and the like, are the same as those of FIG. 6(a).

Figure 7A:
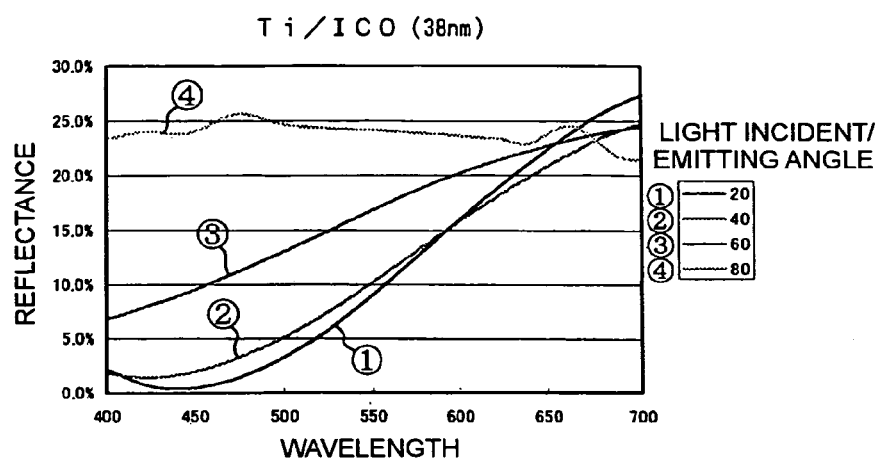
FIGS. 7A and 7B are graphs depicting a relationship between a reflectance and a light incident/emitting angle of Ti/ICO.
Figure 7B:
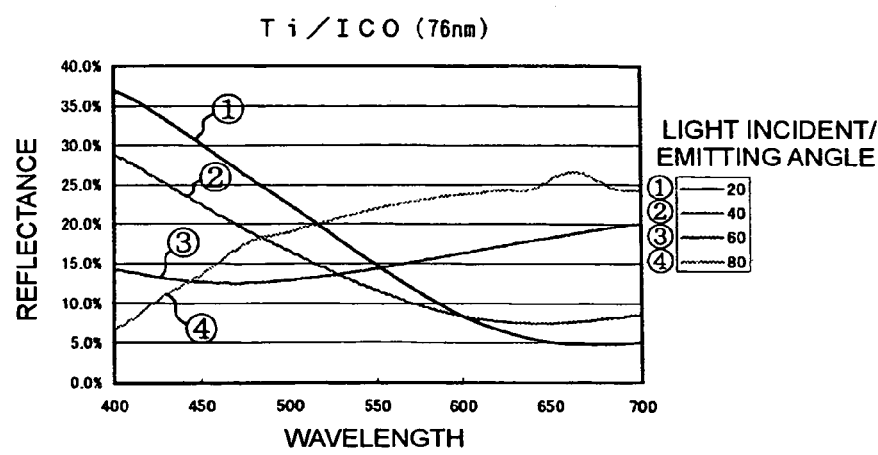

FIG. 7 is a graph depicting a relationship between a wavelength of the reflectance and a light incident/emitting angle, in which the first low-reflection layer 3 is deposited with Ti and the second low-reflection layer 4 is deposited with ICO. In FIG. 7(a), ICO of the second low-reflection layer 4 is deposited in a thickness of 38 nm, and in FIG. 7(b), ICO of the second low-reflection layer 4 is deposited in a thickness of 76 nm. ICO is deposited by the sputtering method using a target made of indium cerium oxide containing 20 at % (ratio of the number of atoms (molecules)) of cerium oxide. Although there are differences between the wavelengths capable of reducing the reflectance and the light incident/emitting angles due to its thickness, it will be understood that any of the cases reduce the reflectance of the light having a wavelength of approximately 500 nm of which the visibility is high. Further, according to FIGS. 6 and 7, it will be understood that the case where the first low-reflection layer 3 is made of Ti can suppress the reflection of the light incident from the exterior.

According to the first exemplary embodiment described above, the reflectance of the light, which is incident from the exterior, from the display portion (including the pixel region and a peripheral region of the pixel) of the display panel can be reduced by the low-reflection layer including the first low-reflection layer 3 and the second low-reflection layer 4. Further, the basic structure of the low-reflection layer is made of two layers including the first low-reflection layer 3 and the second low-reflection layer 4, and the layers are used as the electrode, thereby simplifying the structure and manufacture of the display panel. In addition, it is considered that the interaction of the second low-reflection layer 4, the EL layer 5 and the conductive film 6, and the interaction of their boundaries totally reduce the reflection of the display panel. In particular, the structure of reducing the reflection according to an aspect of the present invention is effective with the display panel (display device) employing the organic EL element which is self-luminescent.

Second Exemplary Embodiment

Figure 8:
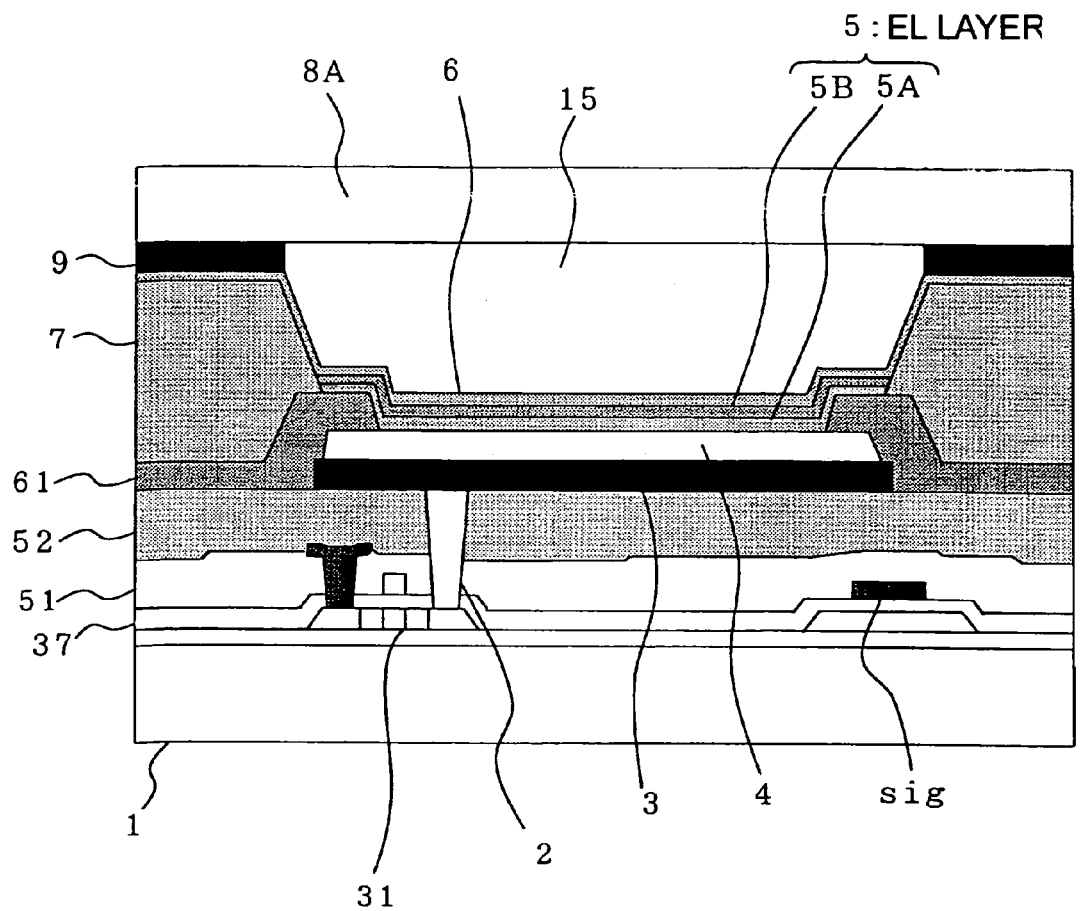
FIG. 8 is a partial cross-sectional view of a display panel according to a first example of a second exemplary embodiment of the present invention.

FIGS. 8 and 9 are partial cross-sectional views showing a construction of a display panel according to a second exemplary embodiment of the present invention. In the drawings, since elements indicated by the same reference numerals as those in FIG. 1 are the same or equivalent as those described in the first exemplary embodiment, the description thereof will be omitted herein.

Instead of the sealing film 8 of the first exemplary embodiment, the second exemplary embodiment forms a low-reflection layer to reduce the reflectance of light incident from the exterior between the light-emitting layers by using a transparent sealing plate 8A, such as a resin or glass functioning as a sealant, i.e., at a region of the sealing plate 8A opposite to the partition wall 7. Accordingly, in the second exemplary embodiment, it is not necessary to extend the low-reflection layer including the first low-reflection layer 3 and the second low-reflection layer 4 to the bottom portion of the partition wall. Further, the low-reflection layer is made of a black layer including carbon black, carbon, carbon allotrope or chrome oxide, or the low-reflection layer including the first low-reflection layer and the second low-reflection layer, which are aforementioned.

In FIG. 8, a black resist 9 (resin including carbon black) is coated and formed as the black layer, and the light incident to the partition wall 7 from the exterior is absorbed and shielded by the black resist 9. Accordingly, such a structure of the display panel reduces the reflectance of the light in the pixel region by using the low-reflection layer including the first low-reflection layer 3 and the second low-reflection layer 4 and also reduces the reflectance of the light in the partition region between the pixels by absorbing light by using the black resist 9.

In FIG. 9, low-reflection layers include a third low-reflection layer 3A and a fourth low-reflection layer 4A, in which each correspond to the first low-reflection layer 3 and the second low-reflection layer 4 of the bottom portion of the EL layer 5, is formed on a sealing plate 8A as the low-reflection layer. It is not necessary to use the same material for the third low-reflection layer 3A and the first low-reflection layer 3 or to use the same material for the fourth low-reflection layer 4A and the second low-reflection layer 4. It can properly combine the material within a range of the material described in the first exemplary embodiment. Accordingly, such a structure of the display panel reduces the reflectance of the light in the pixel region by using the low-reflection layer including the first low-reflection layer 3 and the second low-reflection layer 4 and also reduces the reflectance of the light in the partition wall region between the pixels by using the low-reflection layer including the third low-reflection layer 3A and the fourth low-reflection layer 4A.

In addition, the formation of the black layer on the sealing plate 8A is performed by the coating, the vacuum deposition method, the sputtering method, or the like, of the black material. Further, a thickness of the black layer is 1 to 2 μm in the case of utilizing the coating of the black resist containing the black carbon, and is 0.3 to 1 μm in the case of utilizing the sputtering method or the vacuum deposition method of carbon, carbon allotrope, chrome oxide, or the like, thereby it is possible to easily manufacture the process product and obtain a sufficiently low reflectance. Further, the low-reflection layer including the third low-reflection layer 3A and the fourth low-reflection layer 4A may be formed as the low-reflection layer including the first low-reflection layer 3 and the second low-reflection layer 4. In this case, it is not necessary to perform surface polishing as in the first exemplary embodiment.

The sealing plate 8A with the black layer or the low-reflection layer formed thereon is adhered by the adhesive to the partition wall 7 in the final process of manufacturing the panel shown in the first exemplary embodiment. Alternatively, the sealing plate 8A may be formed with a concave portion on the side to be adhered to the substrate with the device formed thereon. In this case, a space 15 between the sealing plate 8A and the conductive film may be filled with a desiccant to absorb moisture permeated into the interior or the adhesive.

Third Exemplary Embodiment

Figure 10:
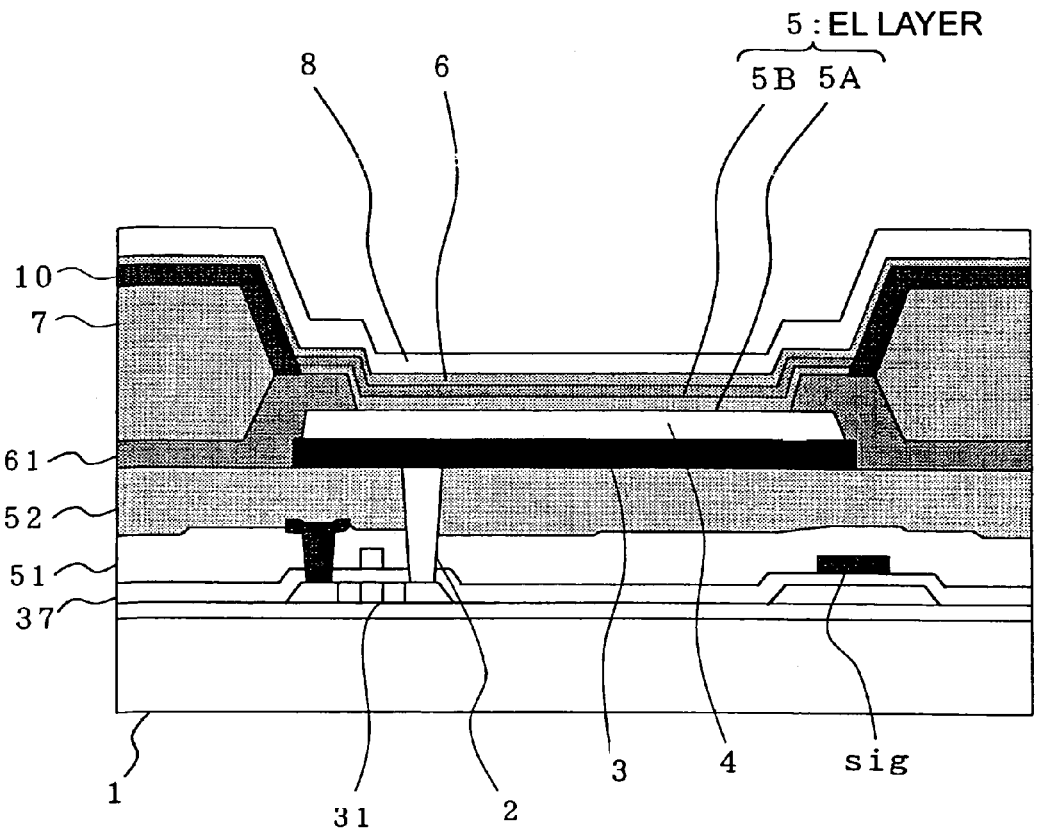
FIG. 10 is a partial cross-sectional view of a display panel according to a first example of a third exemplary embodiment of the present invention.

FIGS. 10 and 11 are partial cross-sectional views showing a construction of a display panel according to a third exemplary embodiment of the present invention. In the drawing, since elements indicated by the same reference numerals as those in FIG. 1 are the same or equivalent as those described in the first exemplary embodiment, the description thereof will be omitted herein. The third exemplary embodiment forms a low-reflection layer on the top face of the partition wall 7 for suppressing the light reflectance between the pixels. That is, instead of forming the low-reflection layer on the bottom portion of the partition wall or the sealant as shown in the first and second exemplary embodiments, the low-reflection layer is formed on the surface of the partition wall 7. Accordingly, in the third exemplary embodiment, it is not necessary to extend the low-reflection layer including the first low-reflection layer 3 and the second low-reflection layer 4 to the bottom portion of the partition wall. Further, the low-reflection layer is made of a black layer including carbon black, carbon, carbon allotrope, or the like, or the low-reflection layer including the same structure as the first low-reflection layer 3 and the second low-reflection layer 4 described above. If necessary, the low-reflection layer may be formed on the side of the partition wall 7, but the low-reflection layer is not utilized because an insulating property is required.

In FIG. 10, a black resist 10 (resin including carbon black) is coated and formed at the front and side of the partition wall 7, and the light incident to the partition wall 7 from the exterior is absorbed by the black resist 10. Accordingly, such a structure of the display panel reduces the reflectance of the light in the pixel region by using the low-reflection layer including the first low-reflection layer 3 and the second low-reflection layer 4 and also reduces the reflectance of the light in the partition wall region between the pixels by the light absorption of the black resist 10.

In FIG. 11, a low-reflection layer including a third low-reflection layer 3A and a fourth low-reflection layer 4A, in which each correspond to the first low-reflection layer 3 and the second low-reflection layer 4 of the bottom portion of the EL layer 5, is formed on the top face of the partition wall 7 as the low-reflection layer, and a black resist 10 is formed on a side of the partition wall 7, as shown in FIG. 10. It is not necessary to use the same material for the third low-reflection layer 3A and the first low-reflection layer 3 or to use the same material for the fourth low-reflection layer 4A and the second low-reflection layer 4. It can properly combine the material within a range of the material described in the first exemplary embodiment. Accordingly, such a structure of the display panel reduces the reflectance of the light in the pixel region by using the low-reflection layer including the first low-reflection layer 3 and the second low-reflection layer 4, and also reduces the reflectance of the light in the partition wall region between the pixels by using the low-reflection layer including the third low-reflection layer 3A and the fourth low-reflection layer 4A and the light absorption of the black resist 10.

Fourth Exemplary Embodiment

Figure 12:
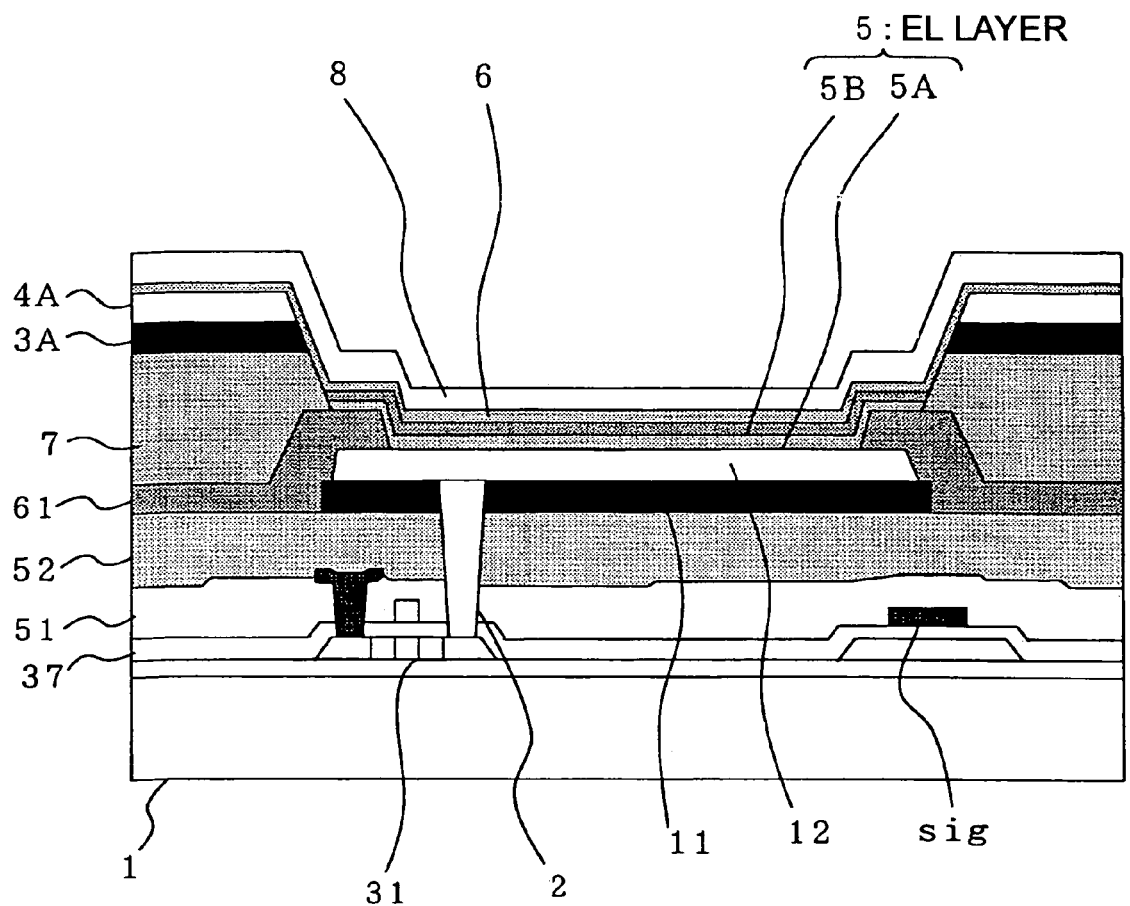
FIG. 12 is a partial cross-sectional view of a display panel according to a first example of a fourth exemplary embodiment of the present invention.
Figure 13:
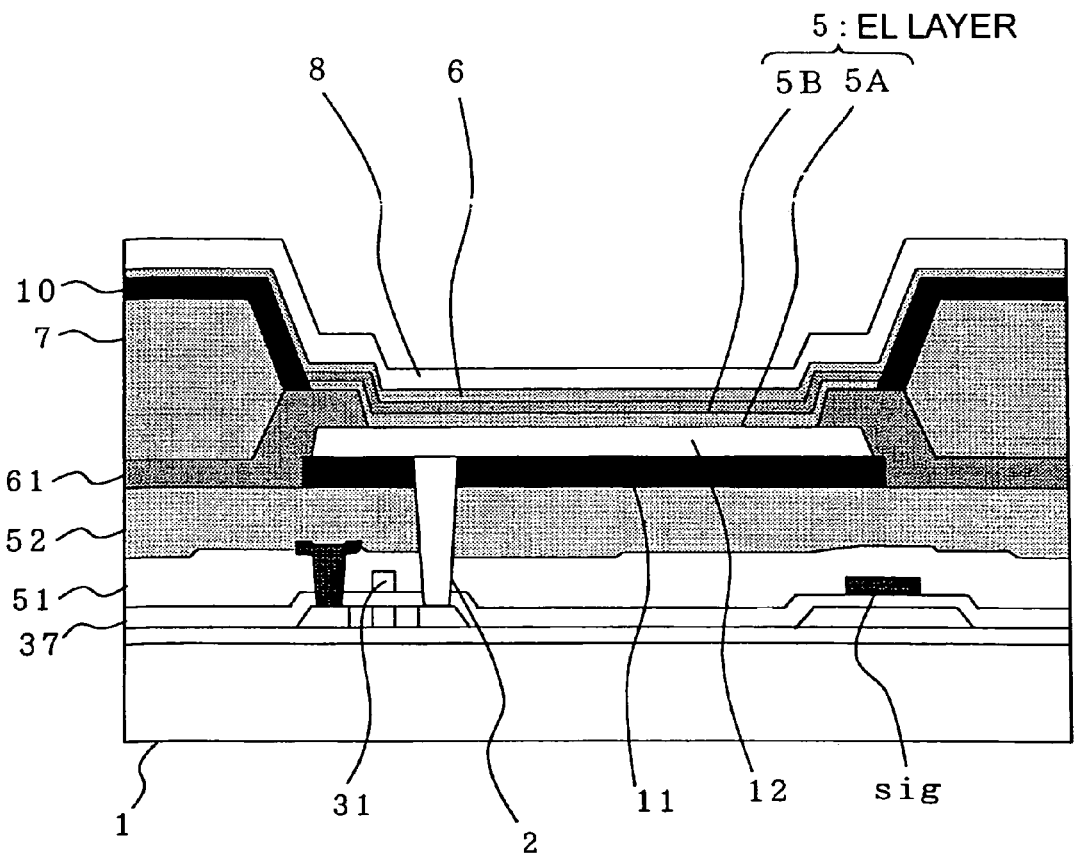
FIG. 13 is a partial cross-sectional view of a display panel according to a second example of a fourth exemplary embodiment of the present invention.

FIGS. 12 and 13 are partial cross-sectional views showing a construction of a display panel according to a fourth exemplary embodiment of the present invention. In the drawings, since elements indicated by the same reference numerals as those in FIG. 1 are the same or equivalent as those described in the first exemplary embodiment, the description thereof will be omitted herein.

The fourth exemplary embodiment forms a black layer to suppress the light reflectance between the substrate 1 and the EL layer 5, instead of the low-reflection layer including the first low-reflection layer 3 and the second low-reflection layer 4 employed in the first, second and third exemplary embodiments. Further, a low-reflection layer to suppress the light reflectance is formed on the top face of the partition wall. Further, the low-reflection layer is made of a black layer including carbon black, carbon, carbon allotrope, or the like, or a low-reflection layer including the same structure as the third low-reflection layer and the fourth low-reflection layer described above. If necessary, the low-reflection layer may be formed on the side of the partition wall 7, but the low-reflection layer is not utilized because an insulating property is required thereon.

In FIG. 12, a black resist 11 (resin including carbon black) is coated and formed on a flattened insulating film 52 between the substrate 1 and the EL layer 5, and an electrode (ITO) as an anode, the EL layer 5 (a hole injecting/carrying layer 5A and a light-emitting layer 5B), and a conductive film 6 as a cathode are formed thereon. In addition, a low-reflection layer including the third low-reflection layer 3A and the fourth low-reflection layer 4A described above is formed on a top of the partition wall 7. Such a structure of the display panel reduces the reflectance of the light in the pixel region by the light absorption of the black resist 11 and also reduces the reflectance of the light in the partition wall region between the pixels by using the low-reflection layer including the third low-reflection layer 3A and the fourth low-reflection layer 4A.

In FIG. 13, a black resist 11 is coated and formed on a flattened insulating film 52 between the substrate 1 and an EL layer 5, and an electrode (ITO) as an anode, the EL layer 5 (a hole injecting/carrying layer 5A and a light-emitting layer 5B), and a conductive film 6 as a cathode are formed thereon. In addition, the black resist 10 is also coated and formed on the top and a side of the partition wall 7. Such a structure of the display panel reduces the reflectance of the light in the pixel region by the light absorption of the black resist 11 and also reduces the reflectance of the light in the partition wall region between the pixels by the light absorption of the black resist 10.

Next, an exemplary method of manufacturing the display panel according to the fourth exemplary embodiment will now be described. The processes performed until the TFT and the flattened insulating film 52 are formed on the substrate 1 are identical to those of the first exemplary embodiment. Next, the predetermined region, on which the EL layer 5 is formed, of a top surface of the flattened insulating film 52 is coated with the insulating black resist 11. The coating may be performed by, for example, a spin coating. In addition, the black resist is patterned in a desired shape (a shape corresponding to the through-hole) by using the photolithography method to form the through-hole, thereby forming the electrode contact 2 between the TFT and the electrode 11.

Next, ITO, which forms the electrode 12, is deposited on the black resist 111 as the aforementioned second low-reflection layer 4 by using the DC magnetron sputtering method. Further, the insulating passivation film 61 is formed as the first exemplary embodiment on the bottom portion on which the partition wall 7 will be formed on this bottom portion.

In addition, the partition wall 7 is formed, and the low-reflection layer is formed on the surface (front side and/or side) of the partition wall thereof, as the first exemplary embodiment. The low-reflection layer is formed by depositing the black resist using a spin coating or by depositing the carbon or carbon allotrope using the sputtering method or the vacuum deposition method. Further, Ti of the third low-reflection layer 3A and ITO of the fourth low-reflection layer 4A are deposited by the sputtering method, which forms a pattern using a metal mask, such as stainless steel, or the like. And then, the display panel is achieved through the process followed by the formation of the EL layer 5 described in the first exemplary embodiment.

In the third and fourth exemplary embodiments, the formation of the black layer made of carbon or carbon allotrope as the low-reflection layer is performed by the sputtering method or the vacuum deposition method. The thickness of the black layer is 1 to 2 μm in the case of utilizing the coating of the black resist containing the black carbon, and the thickness of the black layer is 0.3 to 1 μm in the case of utilizing the sputtering method or the vacuum deposition method of carbon, carbon allotrope, chrome oxide, or the like, thereby making it is possible to easily manufacture the process product and obtain a sufficiently low reflectance. Further, the low-reflection layer including the third low-reflection layer 3A and the fourth low-reflection layer 4A may be formed as the low-reflection layer including the first low-reflection layer 3 and the second low-reflection layer 4. In this case, the surface polishing performed in the first exemplary embodiment is not necessary.

In the fourth exemplary embodiment, the low-reflection layer may be formed on a surface opposite to the partition wall of the sealing plate 8A using the sealing plate 8A which is provided in the second exemplary embodiment, instead of forming the low-reflection layer between the pixels on the surface of the partition wall 7.

Figure 14:
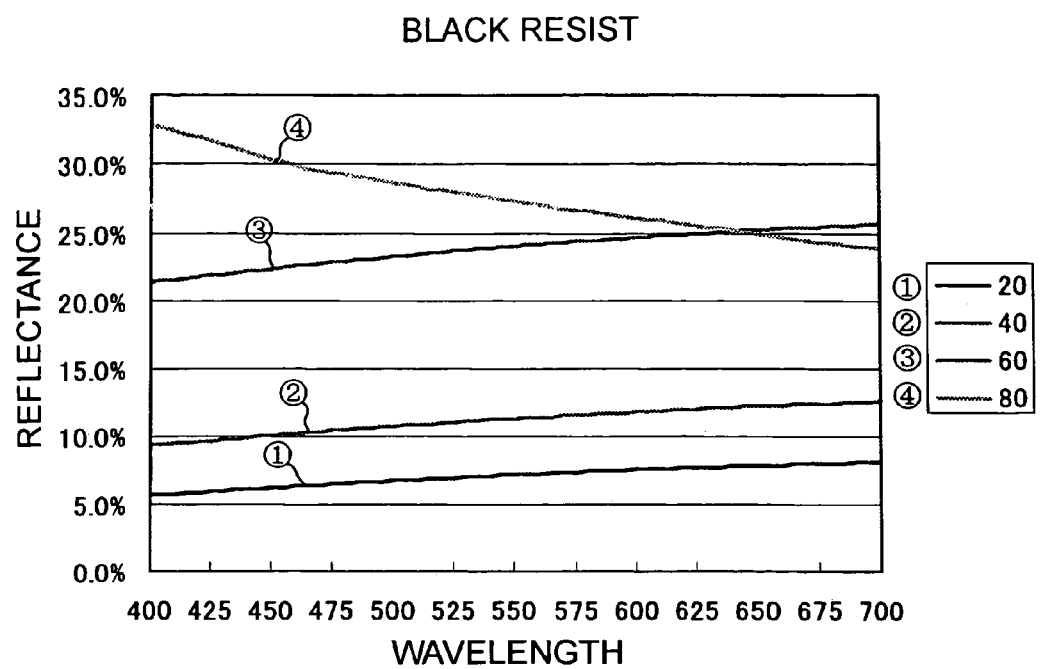
FIG. 14 is a graph depicting a relationship between a reflectance and a light incident/emitting angle of a black resist film.

FIG. 14 is a graph depicting a relationship between a wavelength dependency of the reflectance of the black layer and a light incident/emitting angle due to the black resist 11.

Figure 15:
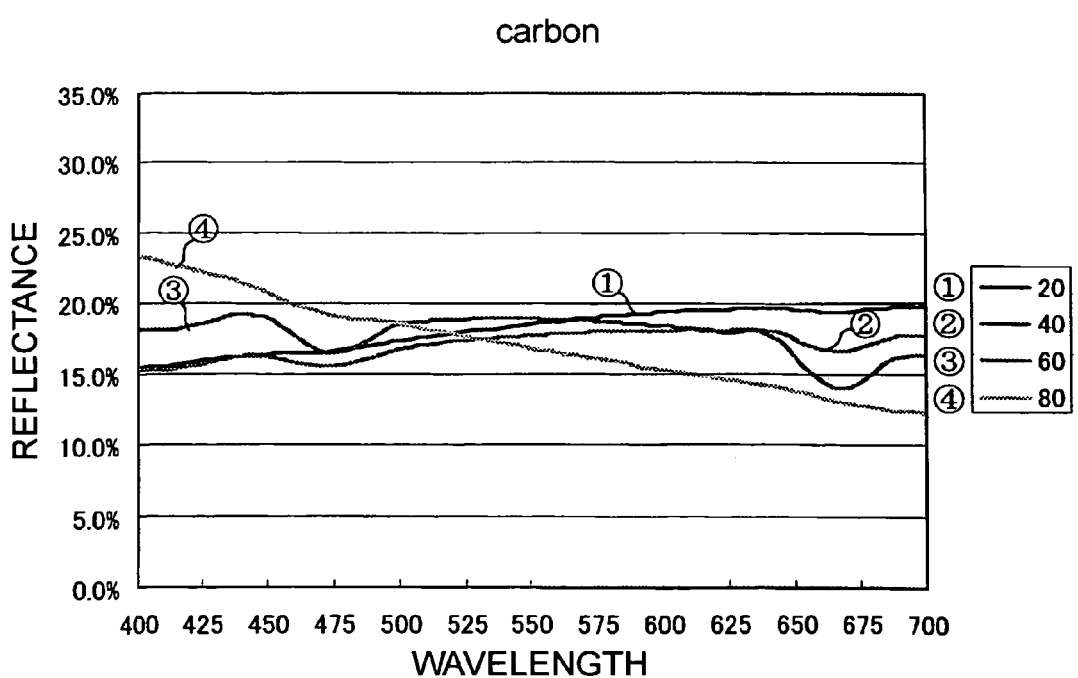
FIG. 15 is a graph depicting a relationship between a reflectance and a light incident/emitting angle of a carbon film.

FIG. 15 is a graph depicting a relationship between a reflectance of the black layer and a light incident/emitting angle due to the carbon. It will be understood from FIGS. 14 and 15 that the reflectance within a range of a visible ray has a small wavelength dependency, in the case of using the black layer as the low-reflection layer.

Although the exemplary embodiments are described as a display panel of an active matrix type utilizing TFT, the present invention is not limited thereto and may be applied to a display panel of a passive matrix type.

Further, although the exemplary embodiments are described on a display panel utilizing an organic EL element. However, the present invention is not limited thereto, and may be applied to a display device utilizing the same flat display panel, such as display panel using an inorganic EL element, a liquid crystal display (LCD), a plasma display panel (PDP), an electrophoresis display (EPD), an electron emitting display (EFD), or the like. The above exemplary embodiment is described on the display panel of a so-called top emission structure in which luminescent light of the light-emitting layer 5B is extracted from a side forming the device, but the first to third exemplary embodiments are not limited thereto, and it may also be applied to a so-called bottom emission structure in which luminescent light is extracted from a side opposite to the side forming the device on the substrate 1. Further, since a reflectance of the glass from which light is extracted is 4%, the glass may be deposited with a multi-layered anti-reflection film or may be treated through an AR (anti-reflection) process, for example, by attaching an anti-reflection film to the glass.

Figure 16A:
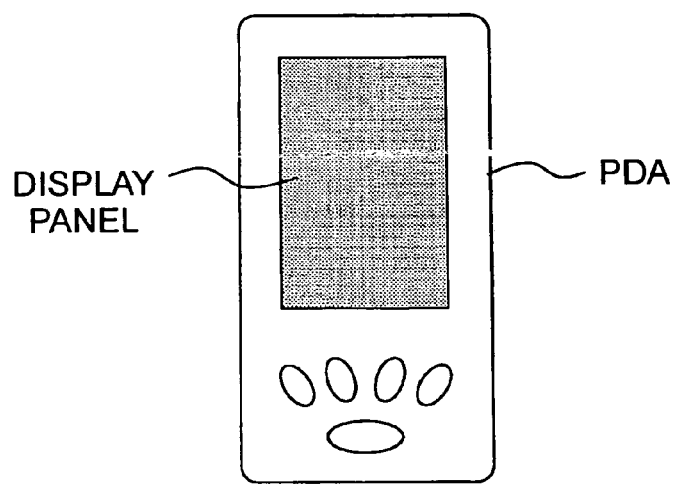
FIGS. 16A–16C are views depicting an electronic apparatus according to the exemplary embodiments of the present invention.
Figure 16B:
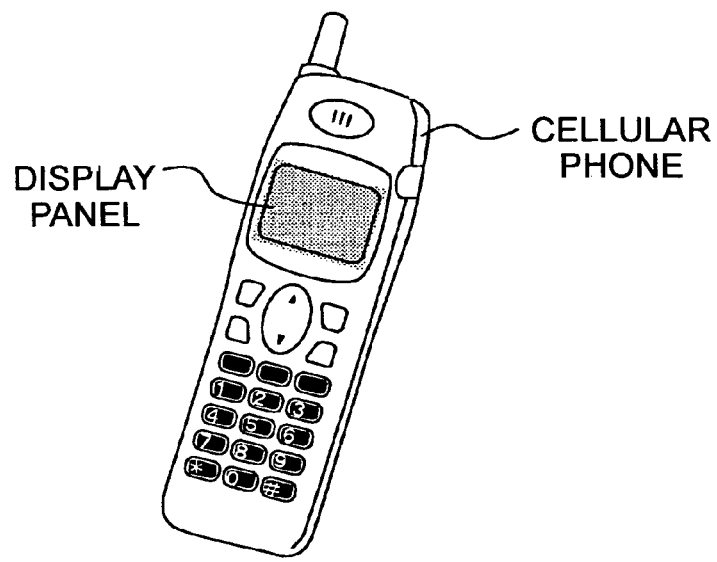
Figure 16C:
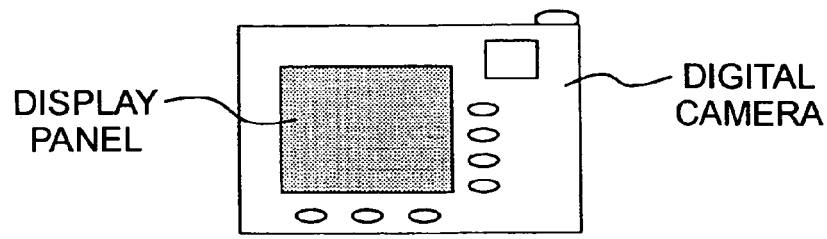

Finally, examples of the electronic apparatus, in which the display panels described in the exemplary embodiments are built, will be described. FIG. 16 is a view depicting the electronic apparatus according to the exemplary embodiment of the present invention. FIG. 16(a) shows a PDA (personal digital assistant), FIG. 16(b) shows a cellular phone, and FIG. 16(c) shows a digital camera. Although it is not shown herein, the display panel of an aspect of the present invention may be applied to the electronic apparatus having a display function and utilizing the display panel, such as personal computers, electronic game consoles or the like. In the electronic apparatuses utilizing the display panel of the present invention, the reduction or suppression of the reflection of the light incident from the exterior at its display unit can be achieved.

The invention claimed is:

1. A display panel, comprising:
a substrate;
an interlayer insulating film and a gate insulating film;
a plurality of low-reflection films; and
a plurality of light-emitting films,
each of the plurality of low-reflection films being disposed between one of the plurality of light-emitting films and the substrate,
each of the low-reflection films including a first low-reflection layer and a second low-reflection layer,
each of the low-reflection films, one of the plurality of light-emitting films, and the substrate being stacked along the direction perpendicular to a principal face of the substrate,
the interlayer insulating film and the gate insulating film being formed between the light-emitting films and the substrate, and each being a separate film from the first and second low-reflection layers,
the low-reflection layers in regions between the light-emitting layers being separated from each other on a pixel to pixel basis, and
an area occupied by each of the plurality of low-reflection films being larger than an area occupied by each of the plurality of light-emitting films.

2. The display panel according to claim 1,
the low-reflection layers deposited between the light-emitting layers formed on the bottom portion of partition walls to separate the light-emitting layers.

3. The display panel according to claim 2, further comprising:
insulating black layers formed on the sides of the partition walls.

4. The display panel according to claim 1,
the first low-reflection layer being a layer made of any one of titanium oxide, titanium nitride, and an alloy of titanium and tungsten.

5. The display panel according to claim 1,
the second low-reflection layer being a layer made of any one of indium tin oxide, indium cerium oxide, and indium zinc oxide.

6. The display panel according to claim 1,
titanium being formed as the first low-reflection layer having a thickness of 30 to 400 μm, and indium tin oxide is formed as the second low-reflection layer having a thickness of 60 to 100 nm.

7. The display panel according to claim 1,
the low-reflection layer including the first low-reflection layer and the second low-reflection layer being an electrode to supply an electric charge to the light-emitting layer.

8. The display panel according to claim 1,
the surface of the second low-reflection layer being polished.

9. The display panel according to claim 1,
the surface of the second low-reflection layer having a chromium film formed thereon.

10. An electronic apparatus including a display panel according to claim 1, and making the display panel perform a display function.

11. The display panel according to claim 1,
wherein an area occupied by each of the plurality of low-reflection films is disposed between areas occupied by the light-emitting films.

12. The display panel according to claim 1,
wherein the first low-reflection layer is made of titanium and the second low-reflection layer is made of an indium alloy or gallium zinc oxide.

13. A display panel, which includes on a substrate a plurality of light-emitting layers, which form pixels, and a sealant disposed on a display side of the light-emitting layers to seal the light-emitting layers, comprising:
an interlayer insulating film and a gate insulating film;
low-reflection layers formed between the substrate and the light-emitting layers, each of the low-reflection layers being formed by laminating a first low-reflection layer made of titanium and a second low-reflection layer made of an indium alloy or gallium alloy, the interlayer insulating film and the gate insulating film being formed between the light-emitting layer and the substrate, and each being a separate film from the first and second low-reflection layers; and
black layers formed on a portion of the sealant opposite to partition walls between the light-emitting layers.

14. A display panel, which includes on a substrate a plurality of light-emitting layers, which form pixels, and a sealant disposed on a display side of the light-emitting layers to seal the light-emitting layers, comprising:

low-reflection layers formed between the substrate and the light-emitting layers, each of the low-reflection layers being formed by laminating a first low-reflection layer made of titanium and a second low-reflection layer made of an indium alloy or gallium alloy; and low-reflection layers formed on a portion of the sealant opposite to partition walls between the light-emitting layers, each of the low-reflection layers being formed by laminating a third low-reflection layer made of titanium and a fourth low-reflection layer made of an indium alloy or gallium alloy, the third and fourth low-reflection layers formed between tops of the partition walls and portions of the sealant opposite to the partition walls.

15. The display panel according to claim 14, the third low-reflection layer made of titanium being a layer made of any one of titanium oxide, titanium nitride, and an alloy of titanium and tungsten.

16. The display panel according to claim 14, the fourth low-reflection layer made of indium alloy being a layer made of any one of indium tin oxide, indium cerium oxide, and indium zinc oxide.

17. The display panel according to claim 14, titanium being formed as the third low-reflection layer having a thickness of 100 to 400 nm, and indium tin oxide being formed as the fourth low-reflection layer having a thickness of 60 to 100 nm.

18. A display panel, which includes on a substrate a plurality of light-emitting layers, which form pixels, and partition walls provided between the light-emitting layers, comprising:

low-reflection layers formed between the substrate and the light-emitting layers, each of the low-reflection layers being formed by laminating a first low-reflection layer made of titanium and a second low-reflection layer made of an indium alloy or gallium alloy; and low-reflection layers formed on the top face of the partition walls, each of the low-reflection layers being formed by laminating a third low-reflection layer made of titanium and a fourth low-reflection layer made of an indium alloy or gallium alloy.

19. A display panel, which includes on a substrate a plurality of light-emitting layers, which form pixels, and partition walls provided between the light-emitting layers, comprising:

an interlayer insulating film and a gate insulating film;

low-reflection layers formed between the substrate and the light-emitting layers, each of the low-reflection layers being formed by laminating a first low-reflection layer made of titanium and a second low-reflection layer made of an indium alloy or gallium alloy, the interlayer insulating film and the gate insulating film being formed between the light-emitting layer and the substrate, and each being a separate film from the first and second low-reflection layers; and black layers formed on the top face of the partition walls, the black layers formed between a sealant and the partition walls.

20. A display panel, which includes on a substrate a plurality of light-emitting layers, which form pixels, and partition walls provided between the light-emitting layers, comprising:

black layers formed between the substrate and the light-emitting layers, the black layers each including a plurality of low-reflection layers; and low-reflection layers formed on the top face of the partition walls, each of the low-reflection layers being formed by laminating a first low-reflection layer made of titanium and a second low-reflection layer made of an indium alloy or gallium alloy, the first and second low-reflection layers being formed in regions which contain no parts of light-emitting layers in a thickness direction of the substrate.

21. A display panel, which includes on a substrate a plurality of light-emitting layers, which form pixels, and partition walls provided between the light-emitting layers, comprising:

black layers formed between the substrate and the light-emitting layers and on the top face of the partition walls, the partition walls being formed on the substrate with a bottom face of the partition walls adjacent to the substrate and a top face of the partition walls away from the substrate.

22. A display panel, which includes on a substrate a plurality of light-emitting layers, which form pixels, partition walls provided between the light-emitting layers, and a sealant disposed on a display side of the light-emitting layers to seal the light-emitting layers, comprising:

black layers formed between the substrate and the light-emitting layers; and black layers formed on the sealant at the portion opposite to the partition walls.

23. A display panel, which includes on a substrate a plurality of light-emitting layers, which form pixels, partition walls provided between the light-emitting layers, and a sealant disposed on a display side of the light-emitting layers to seal the light-emitting layers, comprising:

black layers formed between the substrate and the light-emitting layers; and low-reflection layers formed on the sealant at the portion opposite to the partition walls, each of the low-reflection layers being formed by laminating a first low-reflection layer made of titanium and a second low-reflection layer made of an indium alloy or gallium alloy.

* * * * *